(12) United States Patent
Morrison et al.

(10) Patent No.: US 10,355,451 B2
(45) Date of Patent: Jul. 16, 2019

(54) LASER WITH SAMPLED GRATING DISTRIBUTED BRAGG REFLECTOR

(71) Applicant: Freedom Photonics LLC, Goleta, CA (US)

(72) Inventors: Gordon Barbour Morrison, Summerland, CA (US); Leif Johansson, Santa Barbara, CA (US); Milan L. Mashanovitch, Santa Barbara, CA (US)

(73) Assignee: FREEDOM PHOTONICS LLC, Goleta, CA (US)

( * ) Notice: Subject to any disclaimer, the term of this patent is extended or adjusted under 35 U.S.C. 154(b) by 0 days.

(21) Appl. No.: 15/962,972

(22) Filed: Apr. 25, 2018

(65) Prior Publication Data

US 2018/0287343 A1 Oct. 4, 2018

Related U.S. Application Data

(63) Continuation-in-part of application No. 15/938,842, filed on Mar. 28, 2018.

(60) Provisional application No. 62/489,922, filed on Apr. 25, 2017, provisional application No. 62/596,655, filed on Dec. 8, 2017, provisional application No. (Continued)

(51) Int. Cl.
*H01S 5/12* (2006.01)
*H01S 5/026* (2006.01)
*H01S 5/068* (2006.01)
*H01S 5/125* (2006.01)
*H01S 5/0625* (2006.01)
*G01S 5/12* (2006.01)
*H01S 5/06* (2006.01)
*H01S 5/00* (2006.01)
*H01S 5/065* (2006.01)
*H01S 5/14* (2006.01)
(Continued)

(52) U.S. Cl.
CPC ............ *H01S 5/1209* (2013.01); *H01S 5/026* (2013.01); *H01S 5/068* (2013.01); *H01S 5/0653* (2013.01); *H01S 5/06256* (2013.01); *H01S 5/06258* (2013.01); *H01S 5/125* (2013.01); *H01S 5/1234* (2013.01); *H01S 5/0425* (2013.01); *H01S 5/142* (2013.01); *H01S 5/34* (2013.01)

(58) Field of Classification Search
CPC ........ H01S 5/0653; H01S 5/068; H01S 5/026; H01S 5/34; H01S 5/125
USPC .................................................. 372/20, 50.11
See application file for complete search history.

(56) References Cited

U.S. PATENT DOCUMENTS 4,608,697 A 8/1986 Coldren
4,719,636 A 1/1988 Yamaguchi
(Continued)

OTHER PUBLICATIONS

Hofstetter et al., "Single-growth-step GaAs/AlGaAs distributed Bragg reflector lasers with holographically-defined recessed gratings", Electronics Letters Oct. 27, 1994 vol. 30(22): 1858-1859.
(Continued)

*Primary Examiner* — Tuan N Nguyen
(74) *Attorney, Agent, or Firm* — Knobbe, Martens, Olson & Bear, LLP

(57) ABSTRACT

A laser comprising a laser cavity formed by a broadband mirror and a comb mirror having a plurality of reflection peaks. A spacing between the plurality of reflection peaks is adjusted such that only one reflection peak is in a gain bandwidth of the laser.

20 Claims, 20 Drawing Sheets
(19 of 20 Drawing Sheet(s) Filed in Color)

Related U.S. Application Data

62/489,928, filed on Apr. 25, 2017, provisional application No. 62/490,479, filed on Apr. 26, 2017, provisional application No. 62/594,973, filed on Dec. 5, 2017, provisional application No. 62/477,908, filed on Mar. 28, 2017, provisional application No. 62/489,922, filed on Apr. 25, 2017, provisional application No. 62/596,655, filed on Dec. 8, 2017.

(51) Int. Cl.
*H01S 5/34* (2006.01)
*H01S 5/042* (2006.01)

(56) References Cited

U.S. PATENT DOCUMENTS

| | | | |
|---|---|---|---|
| 4,896,325 A | 1/1990 | Coldren | |
| 5,091,916 A | 2/1992 | Cimini, Jr. et al. | |
| 5,325,392 A | 6/1994 | Tohmori et al. | |
| 7,130,325 B2 | 10/2006 | Oh et al. | |
| 8,401,399 B2 | 3/2013 | Barton et al. | |
| 8,401,405 B2 | 3/2013 | Barton et al. | |
| 8,712,256 B2 | 4/2014 | Barton et al. | |
| 8,718,486 B2 | 5/2014 | Barton et al. | |
| 9,246,596 B2 | 1/2016 | Barton et al. | |
| 9,270,380 B2 | 2/2016 | Barton et al. | |
| 9,344,196 B1 | 5/2016 | Mashanovitch et al. | |
| 9,887,780 B2 | 2/2018 | Barton et al. | |
| 9,941,971 B1 | 4/2018 | Mashanovitch et al. | |
| 2002/0105991 A1 | 8/2002 | Coldren et al. | |
| 2004/0076199 A1* | 4/2004 | Wipiejewski | H01S 5/0265 372/26 |
| 2004/0179569 A1* | 9/2004 | Sato | H01S 5/06256 372/50.11 |
| 2018/0287342 A1 | 10/2018 | Morrison | |

OTHER PUBLICATIONS

Kazuhiro Komori, Shigehisa Arai, Member, IEEE, Yasuharu Suematsu, Isao Arima, Masahiro Aoki, "Single-Mode Properties of Distributed-Reflector Lasers", IEEE Journal of Quantum Electronics, vol. 25, No. 6, Jun. 1989, pp. 1235-1244.

Arimoto et al., "Wavelength-Tunable Short-Cavity DBR Laser Array With Active Distributed Bragg Reflector", Journal of Lightwave Technology, vol. 24(11):4436-4371, Nov. 2006.

Jayaraman et al., "Theory, Design, and Performance of Extended Tuning Range Semiconductor Laser with Sampled Grating", IEEE J. of Quantum Electron., 29, pp. 1824-1834, 1993.

\* cited by examiner

Figure 4A    Device 400
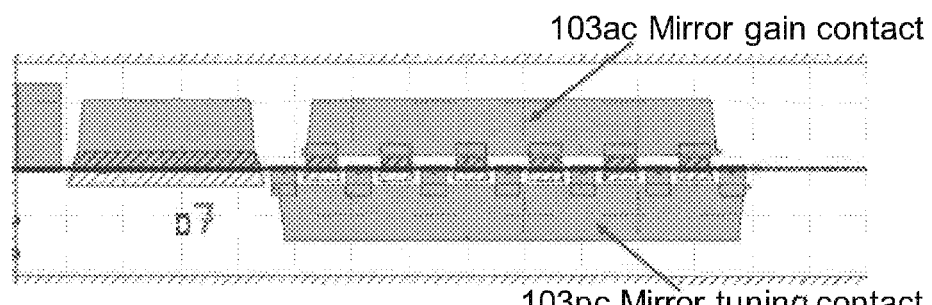
Figure 4B

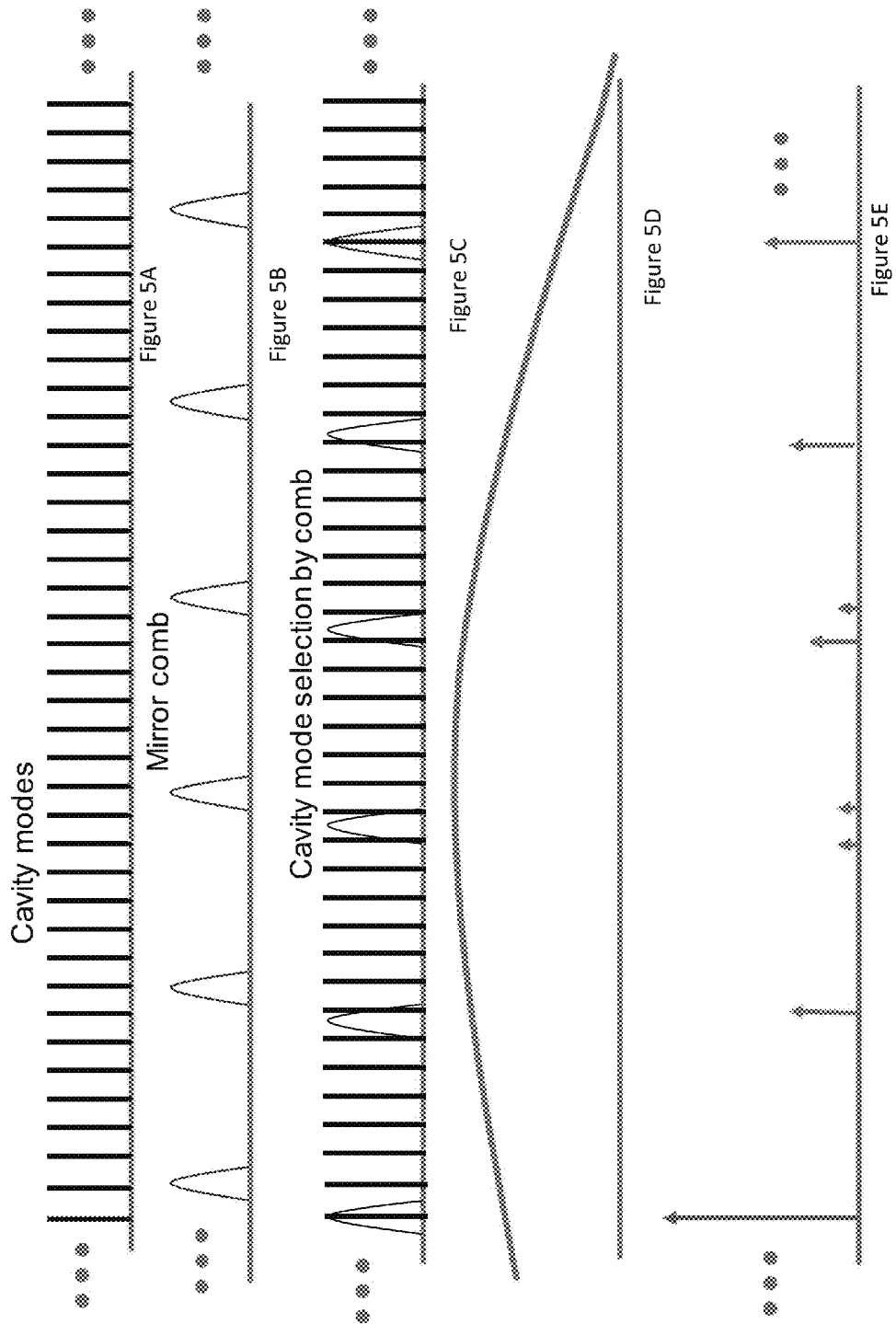

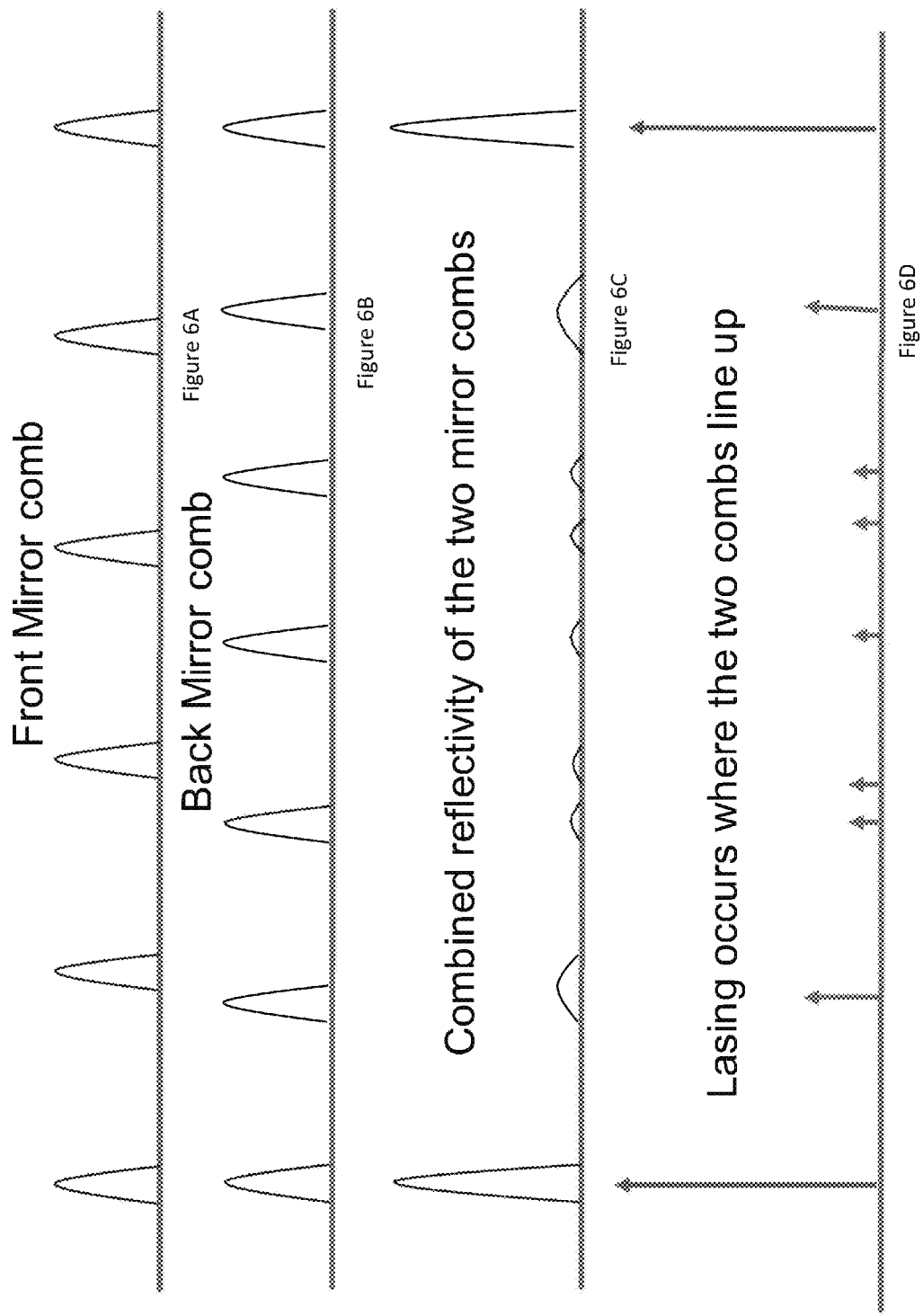

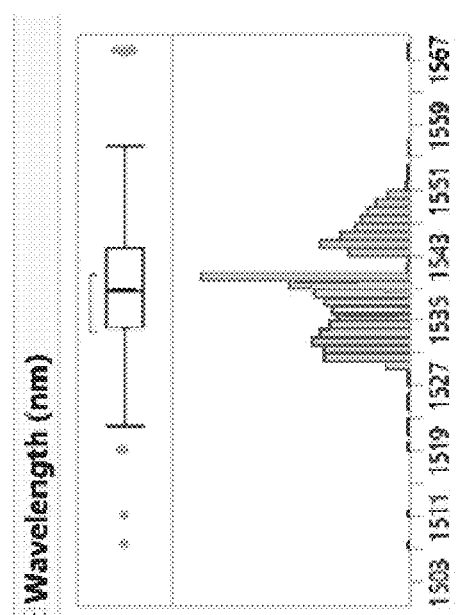
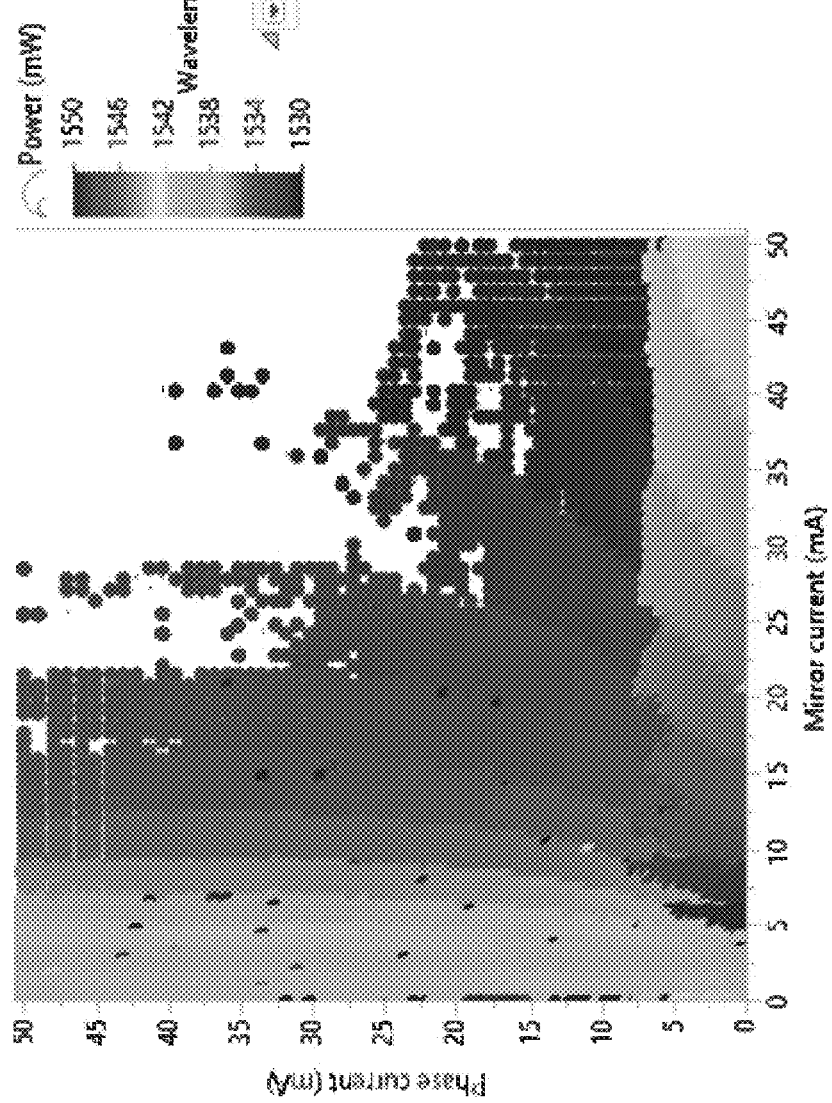
Figure 8A-2
Figure 8A-1

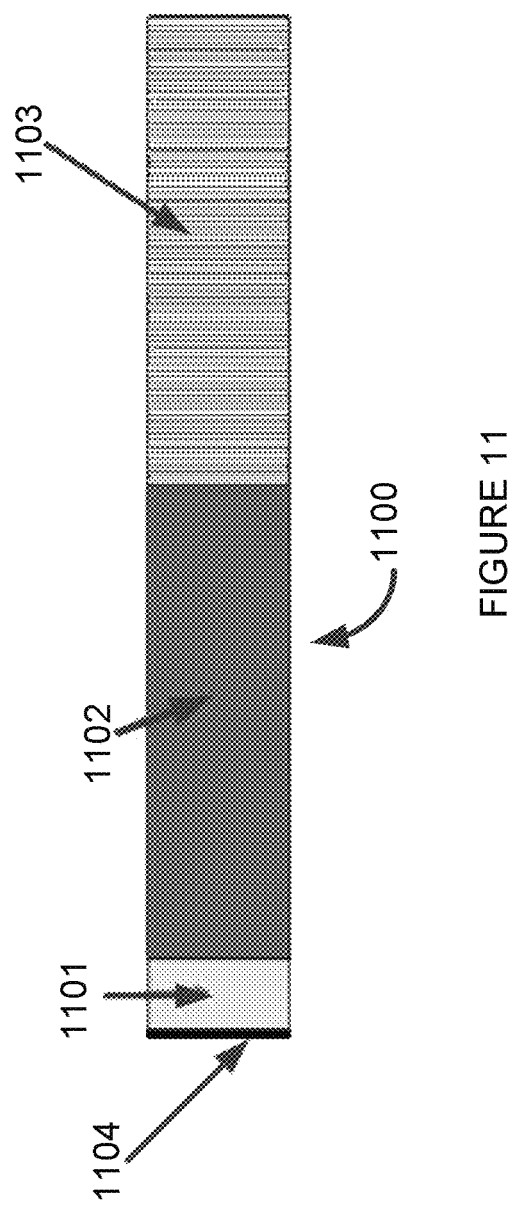

λ

λ

λ

λ

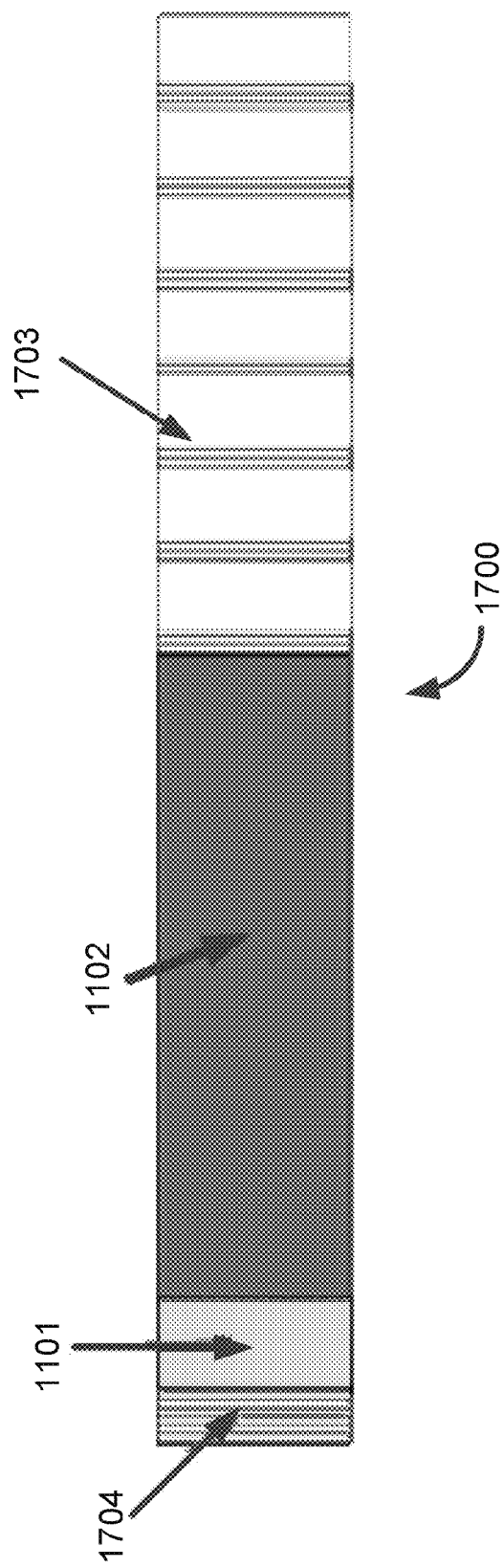

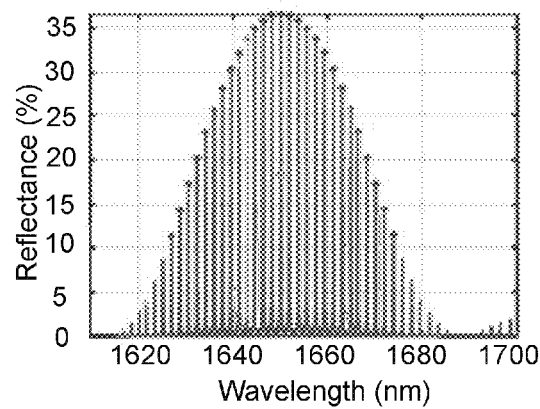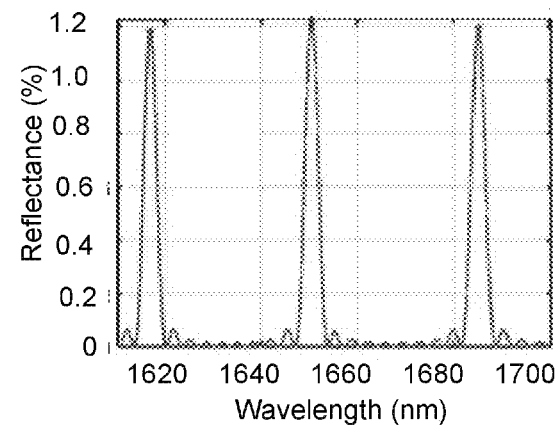
FIGURE 21A
FIGURE 21B

LASER WITH SAMPLED GRATING DISTRIBUTED BRAGG REFLECTOR

CROSS-REFERENCE TO RELATED APPLICATIONS

This application claims the benefit under 35 U.S.C. § 119(e) of U.S. Provisional Application No. 62/489,922 filed on Apr. 25, 2017 titled "Microtune Laser;" and U.S. Provisional Application No. 62/596,655 filed on Dec. 8, 2017 titled "Microtune Laser." Each of the above-identified application is hereby expressly incorporated by reference herein in its entirety.

This application claims the benefit under 35 U.S.C. § 119(e) of U.S. Provisional Application No. 62/489,928 filed on Apr. 25, 2017 titled "SGDBR-Enhanced DBR;" U.S. Provisional Application No. 62/490,479 filed on Apr. 26, 2017 titled "SGDBR-Enhanced DBR;" and U.S. Provisional Application No. 62/594,973 filed on Dec. 5, 2017 titled "SGDBR-Enhanced DBR." Each of the above-identified application is hereby expressly incorporated by reference herein in its entirety.

This application is a continuation-in-part of U.S. application Ser. No. 15/938,842 filed on Mar. 28, 2018 which claims the benefit under 35 U.S.C. § 119(e) of U.S. Provisional Application No. 62/477,908 filed on Mar. 28, 2017 titled "Microtune Laser;" U.S. Provisional Application No. 62/489,922 filed on Apr. 25, 2017 titled "Microtune Laser;" and U.S. Provisional Application No. 62/596,655 filed on Dec. 8, 2017 titled "Microtune Laser." Each of the above-identified application is hereby expressly incorporated by reference herein in its entirety.

BACKGROUND

Field of the Invention

Various embodiments of this application relate to the field of tunable lasers.

Description of the Related Art

Tunable lasers are widely used in telecommunications, sensing, and test and measurement applications. Semiconductor tunable lasers are particularly useful for their small size and low power consumption. One example of a semiconductor tunable laser is a sampled grating distributed Bragg reflector laser (SGDBR) which uses Vernier tuning of two SGDBR (sampled grating distributed Bragg reflector) mirrors. In various embodiments, the sampled grating distributed Bragg reflectors can include a plurality of distributed Bragg reflectors which cumulatively produce a comb of reflections. The full width half maximum and reflection strength of the comb can be tailored by various design parameters including grating burst length, number of bursts, spacing between bursts coupling coefficient etc., Various other embodiments of tunable lasers include Y branch configurations of the above, digital supermode distributed Bragg reflectors, coupled cavity designs, and tunable grating-coupler designs.

SUMMARY

Systems and methods that enable an optical transmitter capable of generating optical signals with various modulation formats may be beneficial in optical networks and systems. Example embodiments described herein have several features, no single one of which is indispensable or solely responsible for their desirable attributes. Without limiting the scope of the claims, some of the advantageous features will now be summarized.

Various embodiments of a tunable laser described herein comprise a laser cavity formed between a broadband mirror and a comb reflector. The laser cavity includes a gain section and an optional phase section. Such embodiments of a tunable laser can achieve a wide wavelength tuning range by utilizing a Vernier effect between cavity modes of the laser cavity and the modes of the comb reflector.

Various embodiments of a tunable laser described herein comprise a Y-branch laser comprising a first branch comprising a first reflector, a gain section and a comb reflector and a second branch comprising a second reflector, an optional phase section and a comb reflector. Wavelength tuning in the Y-branch can be achieved by using a Vernier effect between cavity modes of the laser cavity formed by the first and the second branches and the modes of the comb reflector.

Various embodiments of tunable lasers described herein comprise a laser cavity formed by a comb reflector comprising an optically active material (e.g., gain material). In various embodiments, the laser cavity can comprise lenses or other optical components within the laser cavity. In various embodiments, the laser cavity can be configured as an external cavity laser.

Various embodiments of tunable lasers comprising a comb reflector can be integrated (e.g., monolithically integrated) with additional optical components and/or devices as a photonic integrated circuit. For example, various embodiments of tunable lasers comprising a comb reflector can be monolithically integrated with a semiconductor optical amplifier and/or a modulator (e.g., an electroabsorption modulator (EAM) or a Mach-Zehnder type modulator). The modulator can be configured for direct modulation of light from the tunable laser at bit-rates greater than or equal to about 1 Gbps, greater than or equal to about 2.5 Gbps, greater than or equal to about 10 Gbps, greater than or equal to about 40 Gbps, greater than or equal to about 100 Gbps, greater than or equal to about 256 Gbps, or values in between any of these values.

One innovative aspect of the subject matter of this application includes a wavelength tunable laser comprising a gain medium; a reflective comb mirror disposed at one side of the gain medium, the reflective comb mirror having a plurality of reflection peaks; and a broadband reflector disposed at another side of the gain medium. The reflective comb mirror and the broadband reflector form a laser cavity formed having a plurality of cavity modes. The reflective comb mirror is configured to be electrically or thermally tuned such that at least one of the plurality of reflection peaks overlaps with one of the plurality of cavity modes to generate a laser signal. The reflective comb mirror can comprise additional gain material separate from said gain medium. For example, the reflective comb mirror can comprise one or more sections comprising additional gain material separate from said gain medium. In various embodiments, the gain medium can comprise the reflective comb mirror.

Another innovative aspect of the subject matter of this application is embodied in a wavelength tunable laser comprising a laser cavity formed by a reflective comb mirror and a broadband reflector. The reflective comb mirror has a plurality of reflection peaks. The laser cavity comprises a gain medium. The laser cavity has a plurality of cavity modes. The laser cavity comprises a phase section that is configured to introduce a change in optical path of an optical signal in the laser cavity. The phase section and/or the reflective comb mirror are configured to be electrically or thermally tuned such that at least one of the plurality of reflection peaks of the reflective comb mirror overlaps with one of the plurality of cavity modes to produce a laser signal.

Another innovative aspect of the subject matter discussed herein is embodied in a wavelength tunable laser comprising a gain region comprising a gain medium; a comb mirror disposed at one side of the gain region, the comb mirror having a plurality of reflection peaks; and a broadband mirror disposed at another side of the gain region. A laser cavity formed by the comb mirror and the broadband mirror has a plurality of cavity modes. The comb mirror is configured to be electrically or thermally controlled such that at least one of the plurality of reflection peaks overlaps with one of the plurality of cavity modes.

In various embodiments of the tunable laser, the gain region, the comb mirror and the broadband mirror can be disposed on a substrate comprising at least one waveguide. The substrate can comprise a crystalline material. The gain region can comprise a multi-quantum well semiconductor heterojunction. Various embodiments of the tunable laser can be configured as a semiconductor laser. The comb mirror can comprise one or more regions comprising gain medium. The one or more regions comprising gain medium can be separate from the gain region. The comb mirror can comprise one or more regions that are devoid of the gain medium. In various embodiments, the gain region can comprise the comb mirror. The tunable laser can further comprise a phase section configured to introduce a change in optical path of an optical signal in the laser cavity. The phase section can be configured to be electrically or thermally controlled such that at least one of the plurality of reflection peaks overlaps with one of the plurality of cavity modes. In various embodiments of the laser, two or more reflection peaks of the comb mirror can be accommodated in a gain bandwidth of the gain region. In various embodiments, a length of the laser cavity can be configured such that a non-integer number of cavity modes are between two consecutive reflection peaks of the comb mirror. In various embodiments, the broadband mirror can comprise a cleaved facet.

Yet another innovative aspect of the subject matter discussed herein is embodied in a wavelength tunable laser comprising a crystalline substrate; a waveguide on the crystalline substrate; a first reflector at one end of the waveguide, a second reflector at another end of the waveguide, and a gain region in a cavity formed by the first and the second reflectors. The first reflector comprises a plurality of reflective regions and has a plurality of reflection peaks in a wavelength range. The second reflector has substantially uniform reflectivity for wavelengths in the wavelength range. The gain region comprises a gain medium. The gain region has a gain peak in the wavelength range, the gain peak having a maximum gain; and a gain bandwidth equal to a width of the gain peak at 50% of the maximum gain. The cavity formed by the first and the second reflectors has a plurality of cavity modes. A length of the cavity is configured such that a non-integer number of cavity modes are between consecutive reflection peaks of the first reflector. In some embodiments, the wavelength range can be between about 650 nm and about 1950 nm. In some other embodiments, the wavelength range can comprise at least one of a first range from about 1250 nm and about 1360 nm, a second range from about 1500 nm and about 1580 nm, or a third range from about 1600 nm and about 1700 nm. Various embodiments of the tunable laser can further comprise one or more electrodes configured to provide electrical current or voltage to move the reflection peaks of the first reflector with respect to the cavity modes to select a desired lasing wavelength. In some embodiments, two or more reflection peaks of the first reflector can be within the gain bandwidth. The first reflector can be a comb mirror and the second reflector can be a broadband mirror.

Various embodiments described herein comprise a laser cavity formed by a broadband reflector having a spectral reflectivity curve with a bandwidth between about 20 nm and about 300 nm, a comb mirror having a plurality of reflection peaks, the bandwidth of an individual reflection peak from the plurality of reflection peaks being less than about 10 nm. The wavelength distance between consecutive reflection peaks of the comb mirror (also referred to as free spectral range (FSR) of the comb mirror) can be less than about 50 nm. The laser cavity comprises a gain region between the broadband reflector and the comb mirror. The laser cavity has a plurality of cavity modes. The optical path length is configured adjust the spacing between cavity modes of the laser cavity such that a non-integer number of cavity modes are present between two consecutive reflection peaks of the comb mirror. In various embodiments, two or more reflection peaks of the comb mirror can occur within a gain bandwidth of the laser cavity. In various embodiments, the laser cavity can comprise a phase section which can be used to change a wavelength of a laser signal output from the laser cavity. For example, electrical voltage and/or electrical current can be applied to the phase section to change the wavelength of the laser signal output from the laser cavity. As another example, the phase section can be heated or cooled to change the wavelength of the laser signal output from the laser cavity. In some implementations, position of the plurality of reflection peaks of the comb mirror can be changed to change the wavelength of the laser signal output from the laser cavity. The position of the plurality of reflection peaks of the comb mirror can be changed by applying electrical current or electrical voltage to the comb mirror. In various embodiments, the laser cavity comprising the gain region, the broadband reflector and the comb mirror can be formed on a substrate comprising a waveguide layer. In various embodiments, the substrate can be a crystalline substrate. In various embodiments, the laser cavity comprising the gain region, the broadband reflector and the comb mirror can be monolithically integrated on a substrate comprising a waveguide layer.

The reflective comb mirror can comprise additional gain material separate from the gain medium in the laser cavity. The reflective comb mirror can comprise one or more sections comprising additional gain material separate from the gain medium. In various embodiments, the gain medium of the laser cavity can comprises the reflective comb mirror.

VARIOUS EXAMPLE EMBODIMENTS INCLUDE

Example 1

A laser comprising a SGDBR or a comb reflector at one end of the laser cavity and a broadband reflector at another end of the laser cavity. The SGDBR or comb reflector is configured to provide a reflection peak with a narrow spectral bandwidth with a higher grating coupling coefficient. The SGDBR is configured such that only a single reflection peak of the SGDBR within the gain bandwidth of the laser. The SGDBR can be configured such that other reflection peaks of the SGDBR are outside the gain bandwidth of the laser or outside of the reflection envelope of its own comb. Such a laser can have limited wavelength tunability since no Vernier effect is achieved. Lasing in such a laser can occur at a wavelength at or near the maxima of the reflection peak of the SGDBR that falls in the gain bandwidth.

Example 2

A laser comprising a SGDBR or a comb reflector at one end of the laser cavity and a DBR at another end of the laser cavity. The DBR is configured to select a single reflection peak of the SGDBR while the selected reflection peak of the SGDBR selects the lasing mode. Such a laser may not be broadly tunable due to the lack of Vernier effect.

Example 3

A Y-branch laser comprising a first branch comprising a broadband reflector, a second branch comprising a SGDBR and a third branch comprising a broadband reflector or a DBR.

Example 4

Any of the lasers of Example 1-3 in which the SGDBR or the DBR comprise higher order gratings having order greater than the first order.

Example 5

A single mode laser comprising a first SGDBR or a first comb reflector at one end of the laser cavity and a second SGDBR or a second comb reflector at another end of the laser cavity. The spacing between consecutive reflection peaks of the second SGDBR or the second comb reflector can be greater than the spacing between consecutive reflection peaks of the first SGDBR or the first comb reflector such that only one reflection peak of the first SGDBR or the first comb reflector is selected by the second SGDBR or the second comb reflector. The design of this laser is different from a widely wavelength tunable SGDBR laser in that the second SGDBR or the second comb reflector has a very different comb spacing from the first SGDBR or the first comb reflector (e.g. multiple times FSR) and therefore cannot be tuned over a wide wavelength range.

Example 6

A laser comprising:
a gain region including a gain peak, the gain peak comprising:
a maximum gain; and
a gain bandwidth defined at 30% of the maximum gain;
a reflector at one end of the gain region; and
a reflective grating structure at another end of the gain region, the reflector and the reflective grating structure forming a cavity comprising the gain region, the cavity having a plurality of cavity modes spaced apart from each other,
the reflective grating structure having a plurality of reflectance peaks, wherein a spacing between the plurality of reflectance peaks is configured such that only one reflectance peak from the plurality of reflectance peaks is in the gain bandwidth, and wherein a full width at half maximum of the reflectance peak in the gain bandwidth is greater than or equal to about 0.05 times the cavity mode spacing and less than or equal to about 7 times the cavity mode spacing.

Example 7

The laser of Example 6, comprising a semiconductor material.

Example 8

The laser of any of Examples 6 and 7 comprising a waveguide.

Example 9

A photonic integrated circuit comprising the laser of any of Examples 6-8.

Example 10

The laser of any of Examples 6-9, wherein the reflector is a broadband reflector.

Example 11

The laser of any of Examples 6-10, wherein the reflective grating structure is a sampled grating distributed Bragg reflector (SGDBR).

Example 12

The laser of any of Examples 6-11, wherein the spacing between the plurality of reflectance peaks is greater than or equal to about half the gain bandwidth.

Example 13

The laser of any of Examples 6-12, wherein the spacing between the plurality of reflectance peaks is greater than or equal to about 15 nm and less than or equal to about 200 nm.

Example 14

The laser of any of Examples 6-13, wherein a full width at half maximum of the reflectance peak in the gain bandwidth is greater than or equal to about 1 times the cavity mode spacing and less than or equal to about 5 times the cavity mode spacing.

Example 15

The laser of any of Examples 6-14, wherein the reflectance peak in the gain bandwidth has a reflection magnitude that is at least 20% greater than reflection magnitude of other reflectance peaks of the plurality of reflectance peaks.

Example 16

The laser of any of Examples 6-15, comprising a doped glass.

Example 17

The laser of any of Examples 6-16, wherein the reflector comprises a high reflective coating or a partial reflective coating.

Example 18

The laser of any of Examples 6-17, wherein the reflector comprises a reflective facet.

Example 19

The laser of any of Examples 6-18, configured to output laser light with optical power between about 0.1 mW and 10.0 mW.

Example 20

The laser of any of Examples 6-18, configured to output laser light with optical power between about 100 mW and 3 W.

Example 21

The laser of any of Examples 6-18, configured to output laser light with optical power between about 1 W and 100 W.

Example 22

A laser comprising:
a gain region having a gain peak, the gain peak comprising:
 a maximum gain; and
 a gain bandwidth defined at 30% of the maximum gain;
a first reflective grating structure at one end of the gain region, the first reflective grating structure having a reflectance peak in the gain bandwidth; and
a second reflective grating structure at another end of the gain region, the gain region, the first reflective grating structure and the second reflective grating structure forming a cavity, the cavity having a plurality of cavity modes spaced apart from each other, the second reflective grating structure having a plurality of reflectance peaks,
wherein full width at half maximum of the reflectance peak of the first reflective grating structure is greater than or equal to about 0.05 times the spacing between consecutive reflectance peaks of the plurality of reflectance peaks of the second reflective grating structure and less than or equal to about 7 times the spacing between consecutive reflectance peaks of the plurality of reflectance peaks of the second reflective grating structure, and
wherein a full width at half maximum of the plurality of reflectance peaks of the second reflective grating structure is greater than or equal to about 0.05 times the cavity mode spacing and less than or equal to about 7 times the cavity mode spacing.

Example 23

The laser of Example 22, comprising a semiconductor material.

Example 24

The laser of any of Examples 22 and 23 comprising a waveguide.

Example 25

A photonic integrated circuit comprising the laser of any of Examples 22-24.

Example 26

The laser of any of Examples 22-25, wherein the first reflective grating structure is a distributed Bragg reflector (DBR).

Example 27

The laser of any of Examples 22-26, wherein the second reflective grating structure is a sampled grating distributed Bragg reflector (SGDBR).

Example 28

The laser of any of Examples 22-27, wherein the full width at half maximum of the reflectance peak of the first reflective grating structure is between about 0.1 nm and about 30 nm.

Example 29

The laser of any of Examples 22-28, wherein the full width at half maximum of the plurality of reflectance peaks of the second reflective grating structure is between about 0.01 nm and about 10 nm.

Example 30

The laser of any of Examples 22-29, wherein the spacing between consecutive reflectance peaks of the plurality of reflectance peaks of the second reflective grating structure is between about 0.1 nm and about 20 nm.

Example 31

The laser of any of Examples 22-30, comprising a doped glass.

Example 32

The laser of any of Examples 22-31, wherein the first reflective grating structure or the second reflective grating structure comprises a high reflective coating or a partial reflective coating.

Example 33

The laser of any of Examples 22-32, wherein the first reflective grating structure or the second reflective grating structure comprises a reflective facet.

Example 34

The laser of any of Examples 22-33, configured to output laser light with optical power between about 0.1 mW and 10.0 mW.

Example 35

The laser of any of Examples 22-33, configured to output laser light with optical power between about 100 mW and 3 W.

Example 36

The laser of any of Examples 22-33, configured to output laser light with optical power between about 1 W and 100 W.

Example 37

A laser cavity comprising:
  a gain region having a gain peak, the gain peak comprising:
    a maximum gain; and
    a gain bandwidth defined at 30% of the maximum gain;
  a first reflective grating structure at one end of the gain region, the first reflective grating structure having a first plurality of reflectance peaks spaced apart from each other; and
  a second reflective grating structure at another end of the gain region, the gain region, the first reflective grating structure and the second reflective grating structure forming a cavity, the cavity having a plurality of cavity modes spaced apart from each other, the second reflective grating structure having a second plurality of reflectance peaks spaced apart from each other,
  wherein the spacing between consecutive reflectance peaks of the first plurality of reflectance peaks is between about 1.5 times and about 200 times the spacing between consecutive reflectance peaks of the second plurality of reflectance peaks, such that only one reflectance peak of the first plurality of reflectance peaks is in the gain bandwidth.

Example 38

The laser of Example 37, comprising a semiconductor material.

Example 39

The laser of any of Examples 37 and 38 comprising a waveguide.

Example 40

A photonic integrated circuit comprising the laser of any of Examples 37-39.

Example 41

The laser of any of Examples 37-40, wherein the first reflective grating structure or the second reflective grating structure is a sampled grating distributed Bragg reflector (SGDBR).

Example 42

The laser of any of Examples 37-41, wherein the full width at half maximum of the reflectance peak of the first reflective grating structure is between about 0.01 nm and about 10 nm.

Example 43

The laser of any of Examples 37-42, wherein the full width at half maximum of the reflectance peak of the second reflective grating structure is between about 0.01 nm and 10 nm.

Example 44

The laser of any of Examples 37-44, wherein the spacing between consecutive reflectance peaks of the plurality of reflectance peaks of the second reflective grating structure is between about 0.1 nm and 20 nm.

Example 45

The laser of any of Examples 37-44, comprising a doped glass.

Example 46

The laser of any of Examples 37-45, wherein the first reflective grating structure or the second reflective grating structure comprises a high reflective coating or a partial reflective coating.

Example 47

The laser of any of Examples 37-46, wherein the first reflective grating structure or the second reflective grating structure comprises a reflective facet.

Example 48

The laser of any of Examples 37-47, configured to output laser light with optical power between about 0.1 mW and 10.0 mW.

Example 49

The laser of any of Examples 37-47, configured to output laser light with optical power between about 100 mW and 3 W.

Example 50

The laser of any of Examples 37-47, configured to output laser light with optical power between about 1 W and 100 W.

Example 51

The laser of any of Examples 1-50, comprising antireflection coatings disposed on a side of the reflector, the reflective grating structure, first reflective grating structure or the second reflective grating structure opposite the gain region.

Example 52

The laser of any of Examples 6-51, wherein the reflective grating structure, first reflective grating structure or the second reflective grating structure is configured as a comb mirror.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the following description of the various embodiments, reference is made to the accompanying drawings which form a part hereof, and in which is shown by way of illustration various embodiments of the device.

It is to be understood that other embodiments may be utilized and structural changes may be made without departing from the scope of present invention.

Figure 1:
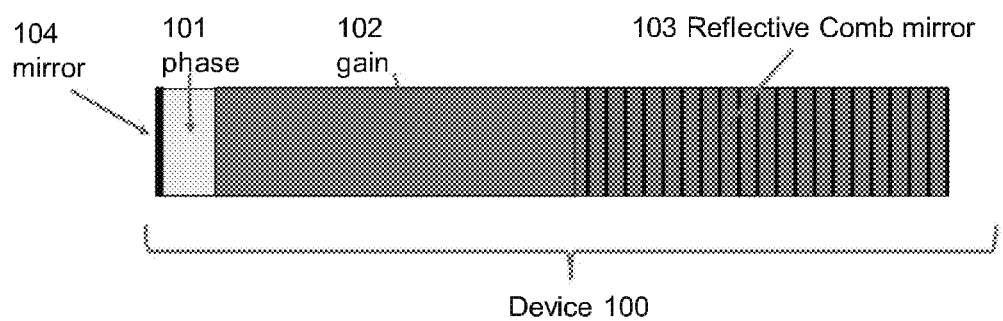

FIG. 1 schematically illustrates an embodiment of a tunable laser comprising a comb reflector.

Figure 2:
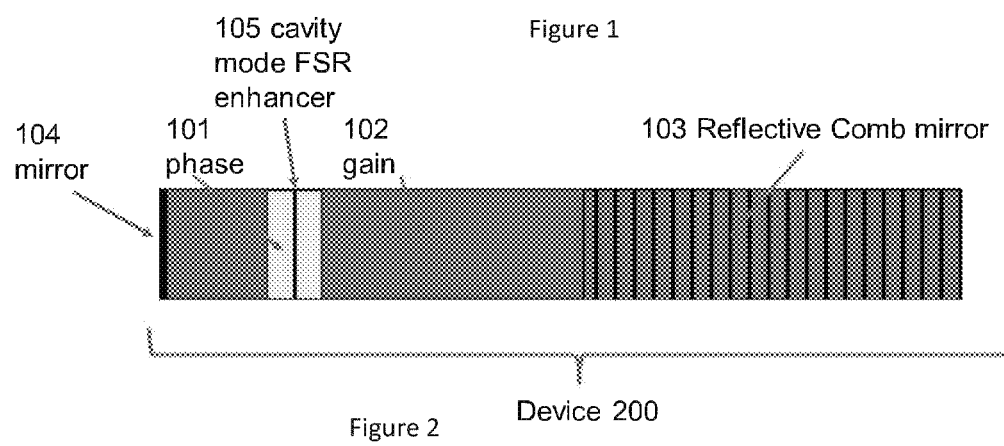

FIG. 2 schematically illustrates an embodiment of a tunable laser comprising a comb reflector and a free spectral range (FSR) enhancing section.

Figure 3:
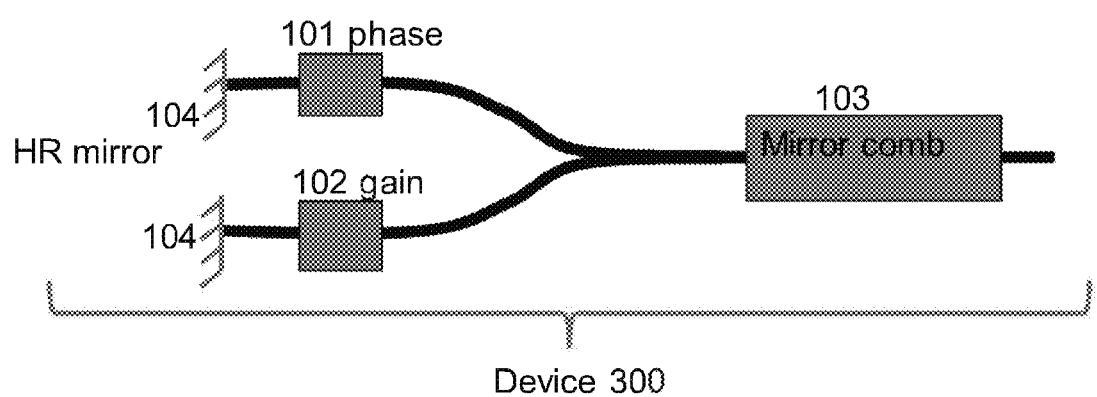

FIG. 3 schematically illustrates an embodiment of a Y-branch laser comprising a comb reflector.

FIG. 4A schematically illustrates an embodiment of a tunable laser comprising a comb reflector with a plurality of sections comprising gain medium. FIG. 4B schematically illustrates an embodiment of a mask layer showing electrical contact regions configured to provide electrical current or voltage to the different portions of the tunable laser illustrated in FIG. 4A.

FIGS. 5A-5E schematically illustrate tuning operation of an embodiment of a tunable laser comprising a comb reflector.

FIGS. 6A-6D schematically illustrate a process of mode selection in a sampled grating distributed Bragg reflector (SGDBR) laser.

Figure 7:
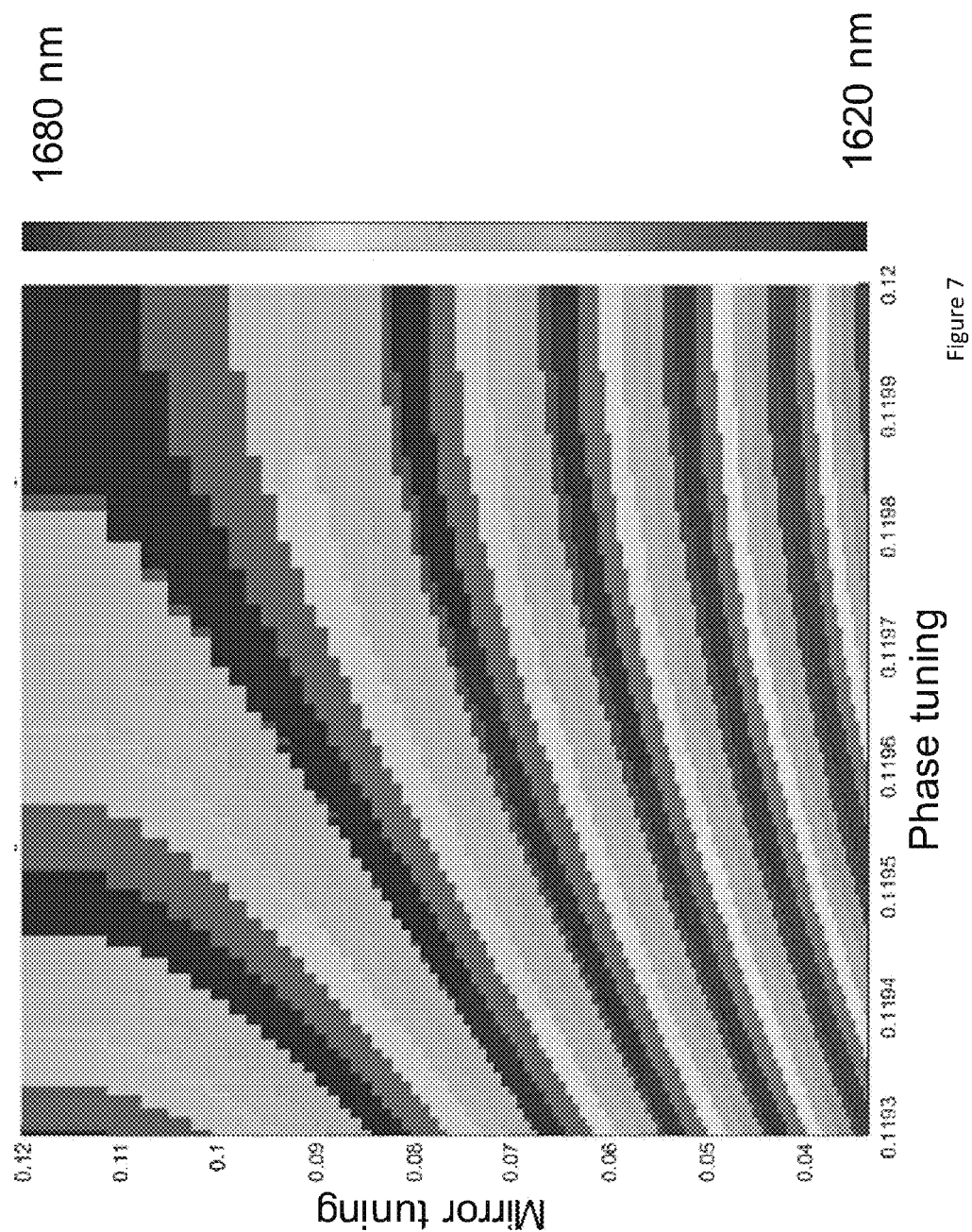

FIG. 7 is a wavelength map generated by simulating the operation of a tunable laser comprising a comb reflector.

FIGS. 8A-1 and 8A-2 illustrate the variation in the wavelength of light output from an embodiment of a tunable laser comprising a comb reflector for different operating conditions.

Figure 9A:
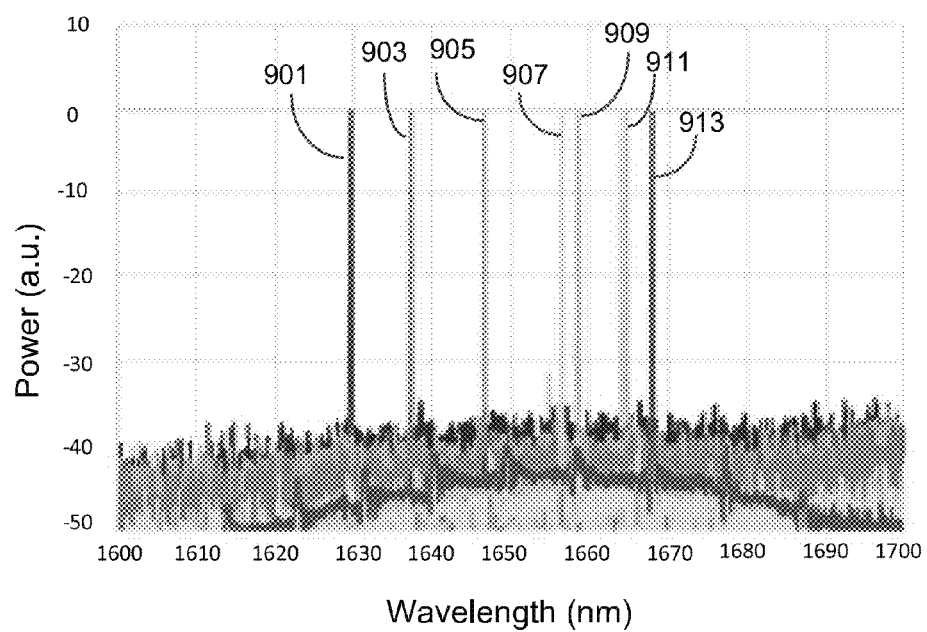
Figures 1, 9B:
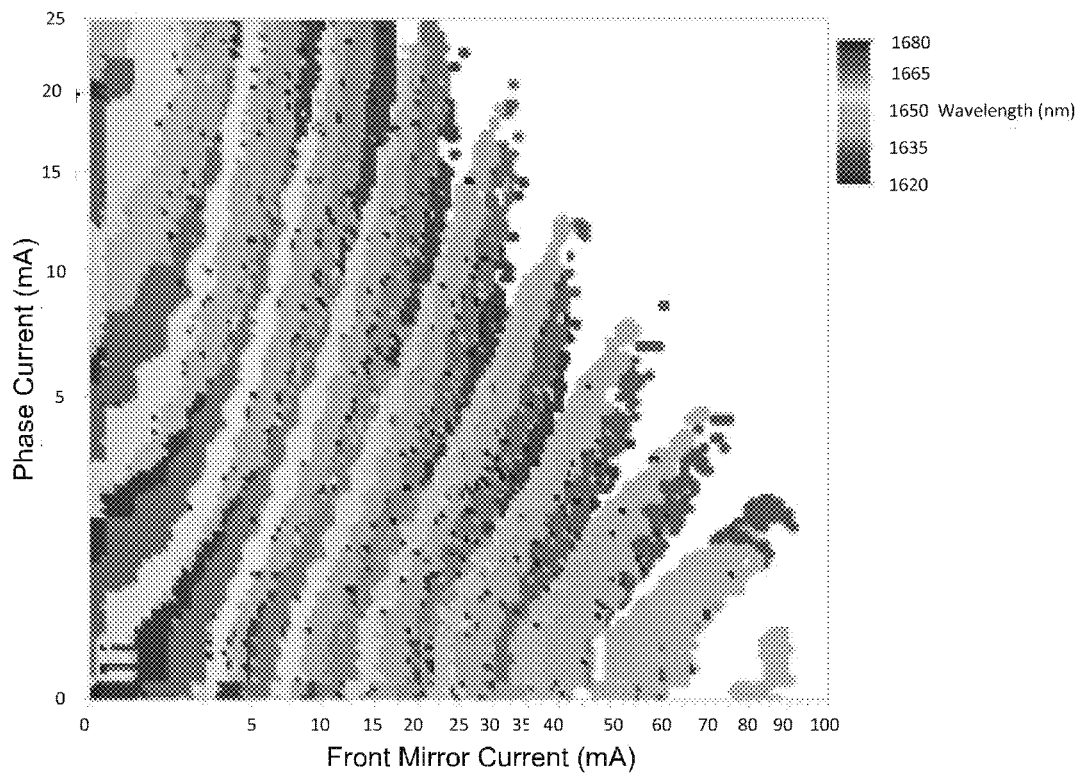
Figures 2, 9B:
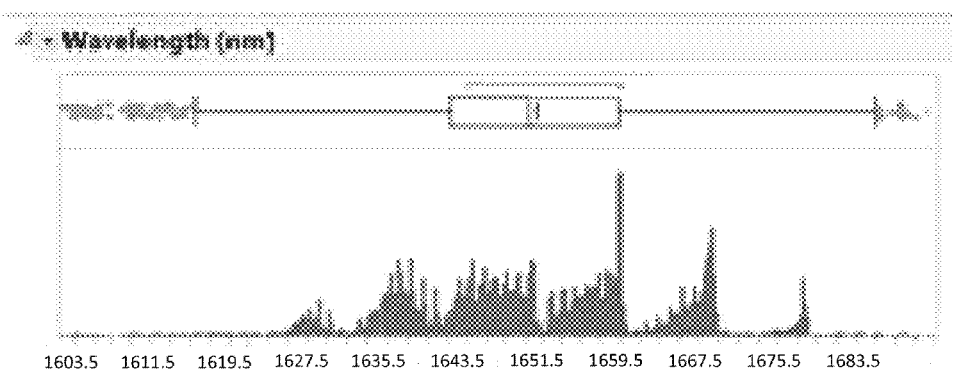

FIG. 9A illustrates the wavelength of light output from an embodiment of a tunable laser comprising a comb reflector at different operating conditions. FIGS. 9B-1 and 9B-2 illustrate the variation in the wavelength of light output from an embodiment of a tunable laser comprising a comb reflector at different operating conditions.

Figure 10:
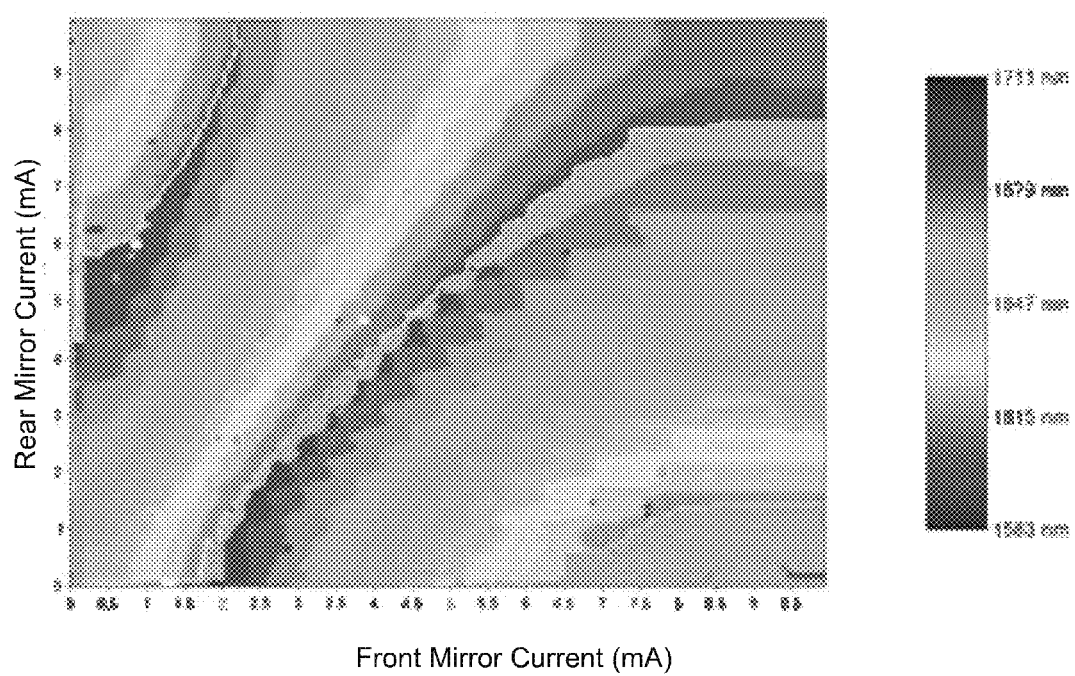

FIG. 10 is the variation in the wavelength of light output from an embodiment of a tunable laser comprising a sampled grating distributed Bragg reflector (SGDBR) laser at both ends of a laser cavity for different operating conditions.

FIG. 11 schematically illustrates an embodiment of a Distributed Bragg Reflector (DBR) laser.

Figure 12A:
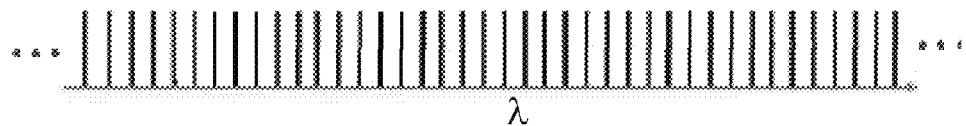
Figure 12B:
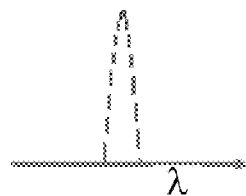
Figure 12C:
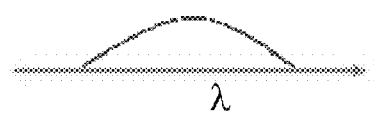
Figure 12D:
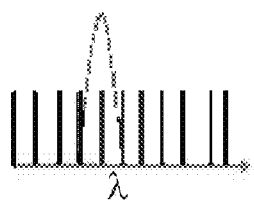
Figure 12E:
Figure 12F:
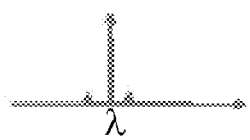
Figure 12G:
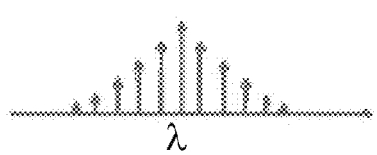

FIGS. 12A-12G depict selection of lasing mode in embodiments of a DBR laser. FIG. 12A illustrates the cavity modes. FIGS. 12B and 12C show reflection peaks for two different embodiments of a DBR. FIG. 12D depicts the overlap of the reflection peak shown in FIG. 12B with the cavity modes. FIG. 12E depicts the overlap of the reflection peak shown in FIG. 12C with the cavity modes. FIG. 12F shows the lasing mode of selected by the DBR having a reflection peak as shown in FIG. 12B. FIG. 12G shows the resulting lasing mode of selected by the DBR having a reflection peak as shown in FIG. 12C. In FIGS. 12A-12G the horizontal axis corresponds to the wavelength and the vertical axis corresponds to the optical power, the reflectivity or eigenmode strength.

Figure 13B:
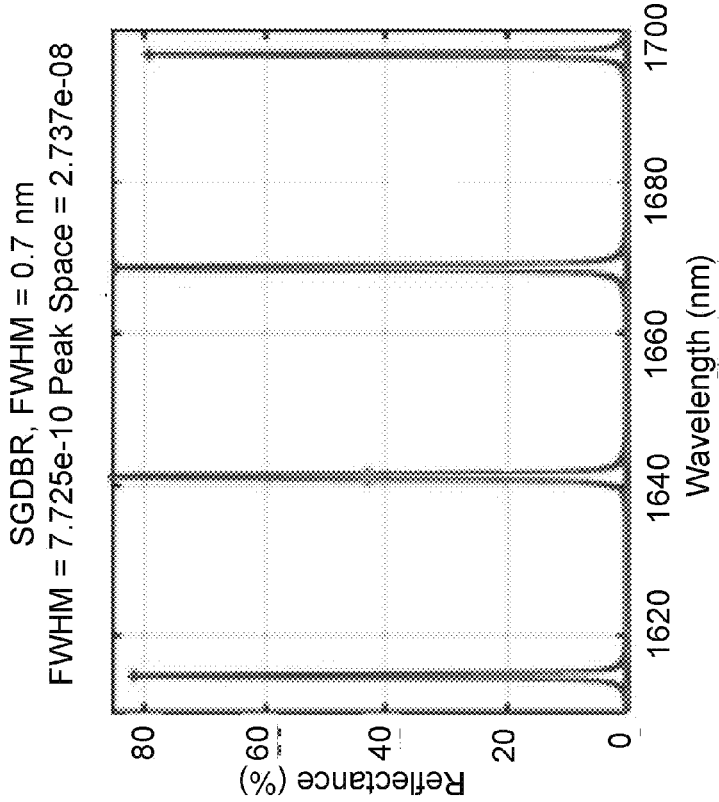
Figure 13A:
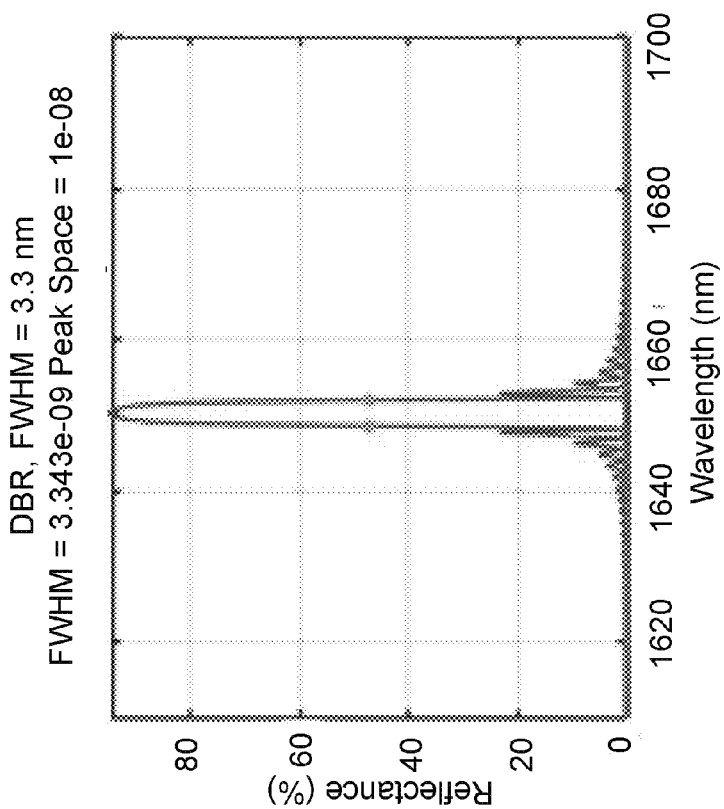

FIGS. 13A and 13B show the comparison between a modelled DBR reflection spectrum and a modelled Sampled Grating Distributed Bragg Reflector (SGDBR) reflection spectrum respectively.

Figure 14:
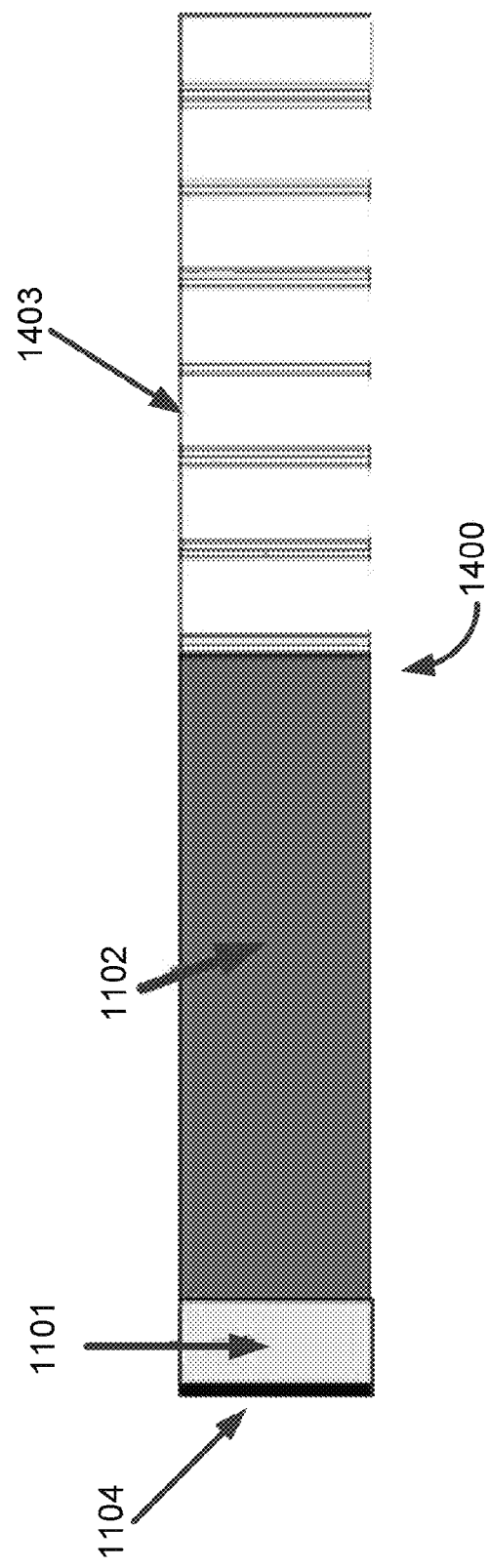

FIG. 14 schematically illustrates an embodiment of a DBR-like laser similar to the laser depicted in FIG. 11 comprising a SGDBR instead of a DBR.

Figure 15A:
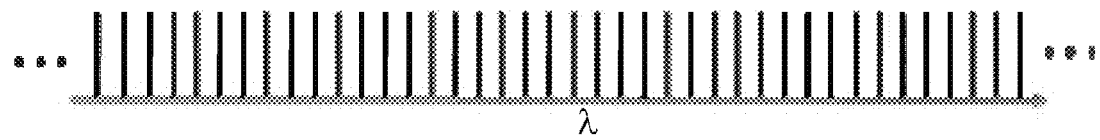
Figure 15B:
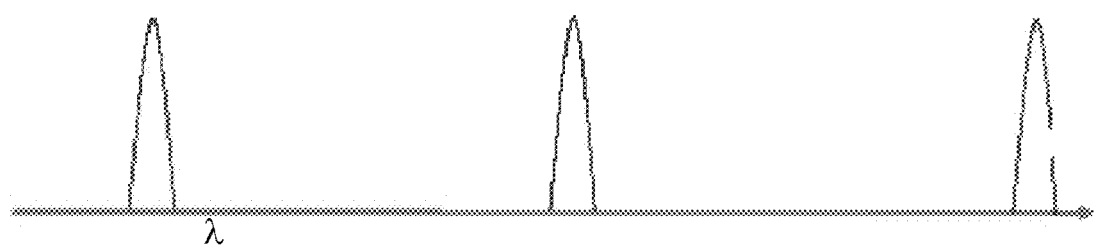
Figure 15C:
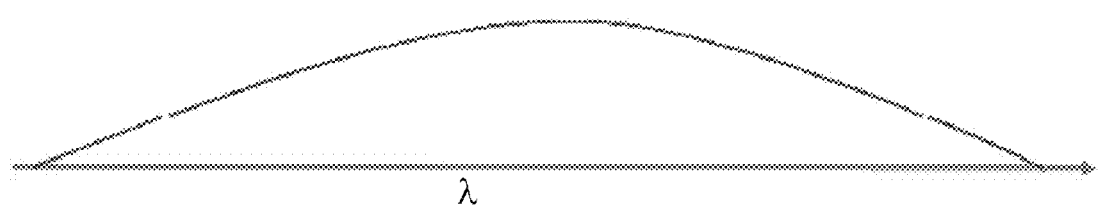
Figure 15D:
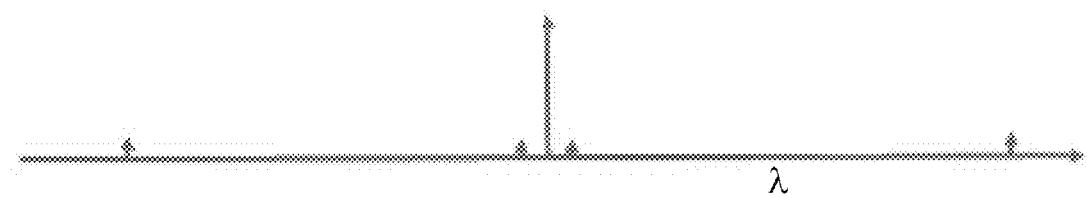

FIGS. 15A-15D illustrate the operation of a laser similar to the laser shown in FIG. 14. FIG. 15A shows the cavity modes. FIG. 15B shows the reflection peaks of the SGDBR. FIG. 15C shows the gain curve of the laser and FIG. 15D shows the resulting lasing mode. In FIGS. 15A-15D the horizontal axis corresponds to the wavelength and the vertical axis corresponds to the optical power, the reflectivity or eigenmode strength.

Figure 16A:
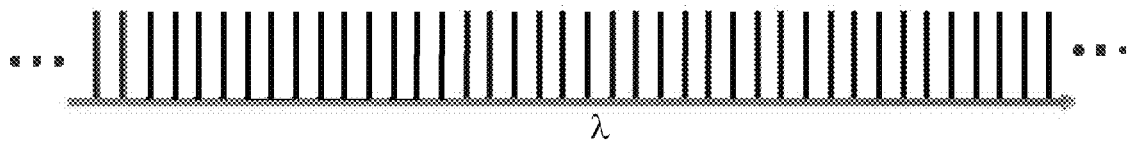
Figure 16B:
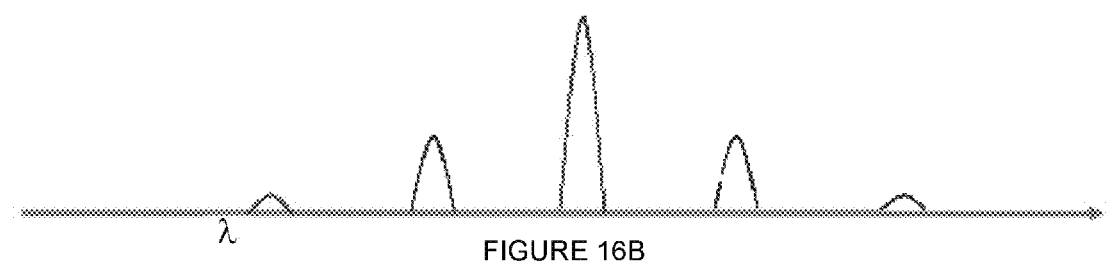
Figure 16C:
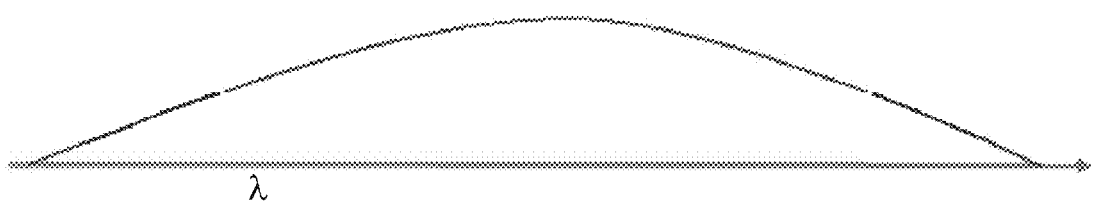
Figure 16D:
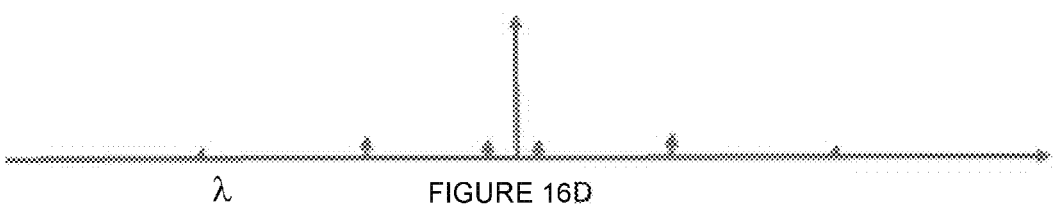

FIGS. 16A-16D show the operation of a laser comprising a SGDBR/comb mirror having a reflection spectrum which decays in reflection magnitude as shown in FIG. 16B. FIG. 16A shows the cavity modes, FIG. 16C shows the gain curve and FIG. 16D shows the resulting lasing mode. In FIGS. 16A-16D the horizontal axis corresponds to the wavelength and the vertical axis corresponds to the optical power, the reflectivity or eigenmode strength.

FIG. 17 schematically illustrates an embodiment of a laser comprising a SGDBR at one end of the laser cavity and a DBR at another end of the laser cavity.

Figure 18A:
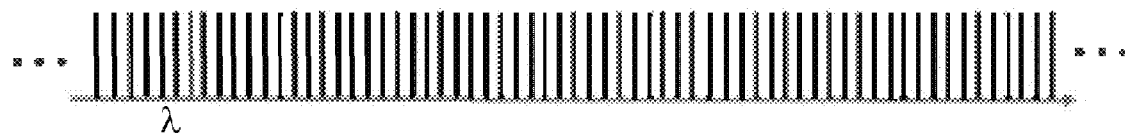
Figure 18B:
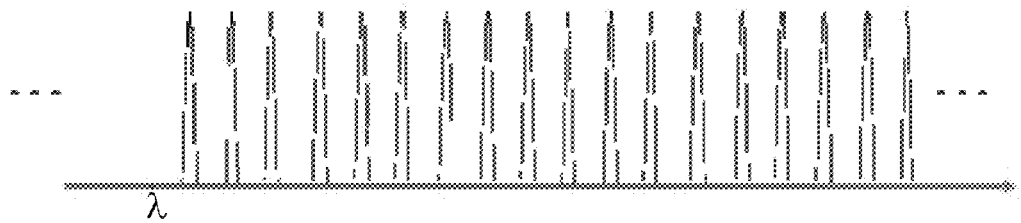
Figure 18C:
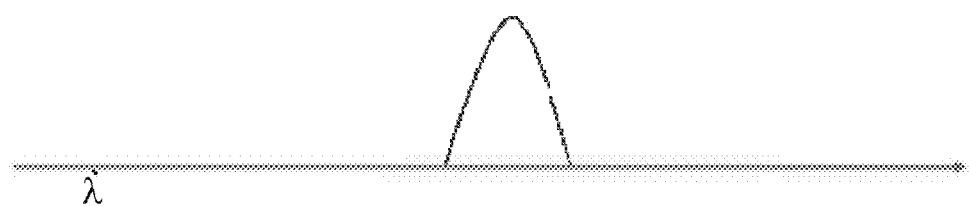
Figure 18D:
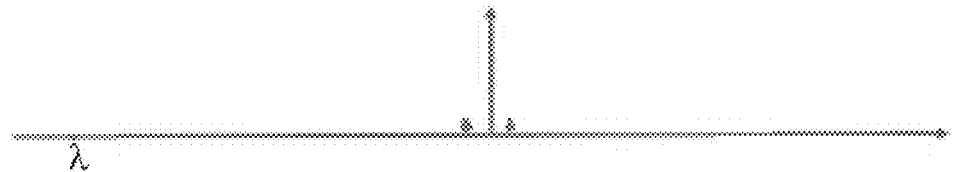

FIGS. 18A-18D show the operation of a laser similar to the embodiment depicted in FIG. 17. FIG. 18A shows the cavity modes, FIG. 18B shows the reflection spectrum of the SGDBR, FIG. 18C shows the reflection spectrum of the DBR and FIG. 18D shows the resulting lasing mode. In FIGS. 18A-18D, the horizontal axis corresponds to the wavelength and the vertical axis corresponds to the optical power, the reflectivity or eigenmode strength.

Figure 19A:
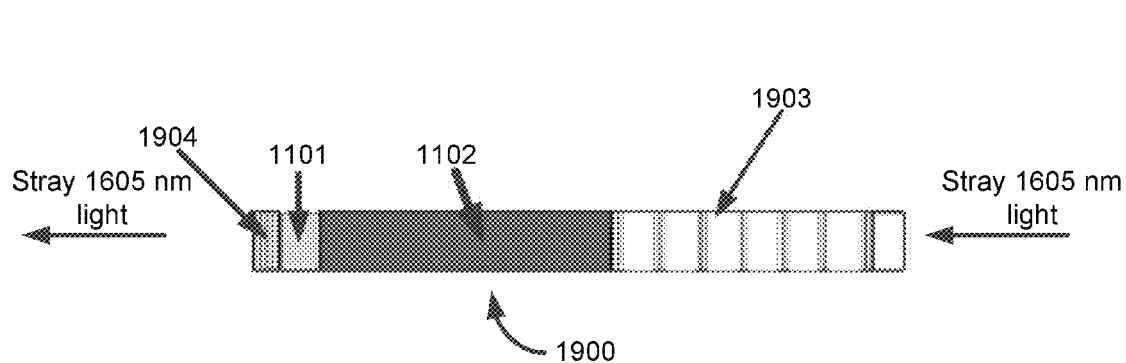
Figure 19B:
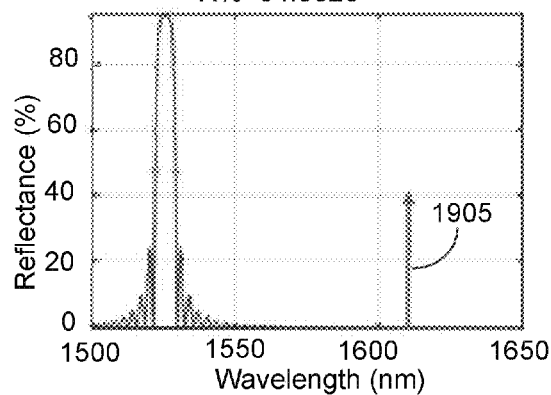
Figure 19C:
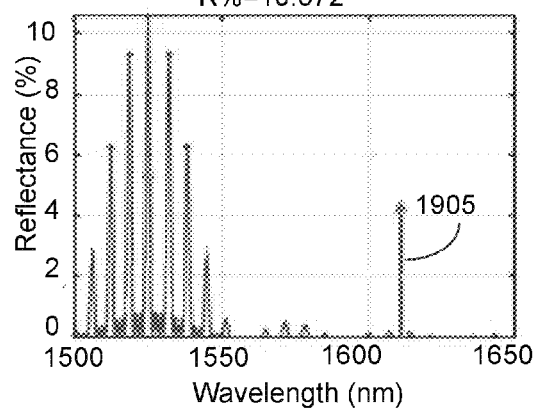

FIG. 19A schematically depicts an embodiment of a laser comprising a SGDBR at one end of the laser cavity and a DBR at another end of the laser cavity. FIG. 19B shows the reflection spectrum of the DBR and FIG. 19C shows the reflection spectrum of the SGDBR which decays in reflection magnitude.

Figure 20:
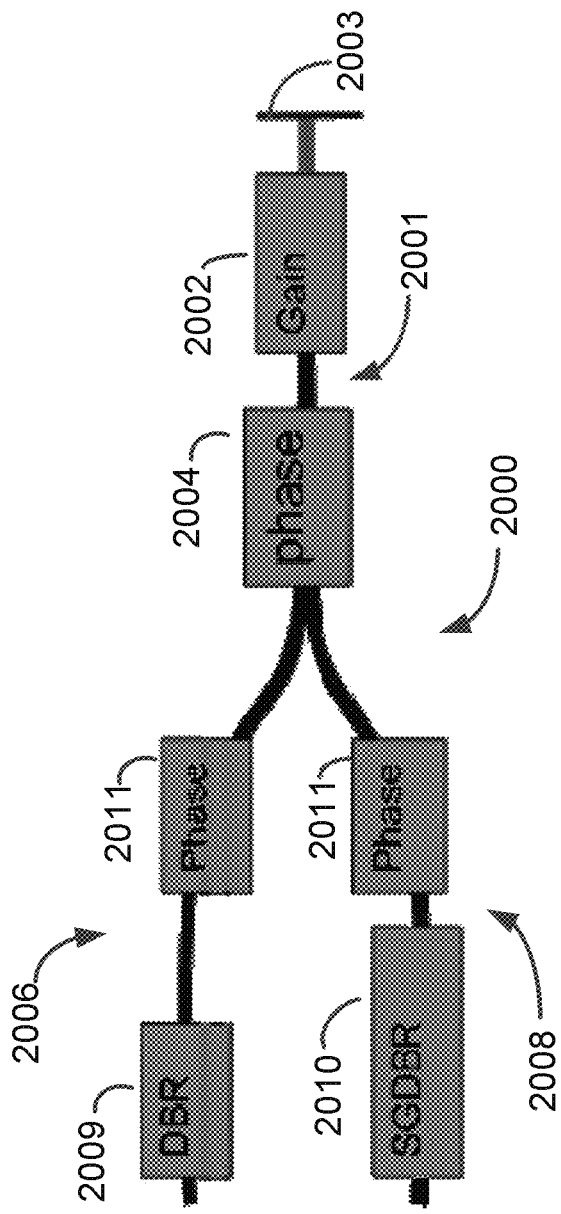

FIG. 20 schematically depicts an embodiment of a Y-branch laser comprising a SGDBR at one end of the laser cavity.

FIG. 21A shows the reflection spectrum of a SGDBR with a dense comb. FIG. 21B shows the reflection spectrum of a SGDBR with a sparse comb. The free spectral range (FSR) of the SGDBR whose reflection spectrum is depicted in FIG. 21B is larger than the FSR of the SGDBR whose reflection spectrum is depicted in FIG. 21A.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements. In addition, where applicable, the first one or two digits of a reference numeral for an element can frequently indicate the figure number in which the element first appears.

DETAILED DESCRIPTION OF THE PREFERRED EMBODIMENT

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements may be present therebetween. For clarity of description, "reflector" or "mirror" can be used interchangeably to refer to an optical element and/or a surface having a reflectivity greater than or equal to about 0.01% and less than or equal to 100% including any value in between.

A new innovative tunable semiconductor laser is contemplated herein that offers advantages of simpler tuning mechanism as well as lower power consumption. Various embodiments of tunable lasers described herein can be tuned with fewer controls (e.g., one or two controls). Various embodiments of the innovative tunable laser comprising a comb mirror described herein comprise a comb mirror to define a series of selectable lasing modes each of which can be continuously tuned over a short wavelength range. The tunable laser can be configured to output a laser signal having a desired wavelength by selecting a lasing mode of the comb mirror that is closest to the desired wavelength and tuning the selected mode to the desired wavelength by temperature tuning and/or electrical tuning. The tuning range of the innovative tunable laser comprising a comb mirror can be greater than or equal to about 5 nm, greater than or equal to about 10 nm, greater than or equal to about 20 nm, greater than or equal to about 50 nm, greater than or equal to about 100 nm, less than or equal to about 200 nm, less than or equal to about 300 nm, less than or equal to about 500 nm, or have any value in a range or sub-range defined by any of these values.

One possible embodiment of the innovative tunable semiconductor laser device is shown in FIG. 1. The laser comprises a gain region 102, a broadband mirror 104 disposed at one end of the gain region 102 and a comb reflector 103 disposed at another end of the gain region 102. The gain region 102 can comprise an optically active material. For example, the gain region 102 can comprise multi-quantum well heterojunctions formed in semiconductor materials, such as, for example, III-V semiconductor materials. The broadband mirror 104 can be a cleaved facet coated with reflective coatings, cleaved facet without any coating or any other broadband reflector. The broadband mirror 104 is disposed at one end of a gain region 102. The broadband mirror 104 can be configured to reflect wavelengths in a broad spectral range substantially uniformly such that the reflectivity of the broadband mirror 104 is within ±10% of an average reflectivity for wavelengths in a wide wavelength range that extends between about 20 nm and about 500 nm. The spectral reflectivity (e.g., reflectivity versus wavelength) curve of the broadband mirror 104 can have a bandwidth (e.g., full width at half maximum (FWHM)) of about 20 nm, about 50 nm, about 100 nm, about 200 nm, about 300 nm, about 500 nm, about 1 micron, about 3 microns, about 10 microns, or any range or combination of ranges between any of these values. Accordingly, the broadband mirror 104 can be configured to substantially uniformly reflect wavelengths between about 300 nm and about 20 microns, between about 300 nm and about 15 microns, between about 300 nm and about 10 microns, between about 300 nm and about 7 microns, between about 300 nm and about 3.5 microns, between about 300 nm and about 1.9 microns, between about 300 nm and about 1.5 microns, between about 1.5 microns and about 1.9 microns, between about 1.3 microns and about 1.5 microns, between about 1.5 microns and about 1.7 microns between about 300 nm and about 1.3 microns, between about 300 nm and about 1.0 micron, between about 300 nm and about 980 nm, between about 300 nm and about 760 nm, between about 300 nm and about 600 nm, between about 400 nm and about 590 nm, or any wavelength range in these ranges/sub-ranges formed by any of these values. The broadband mirror 104 can be configured to reflect between about 0.1% to about 99.9% of incident light. For example, the broadband mirror 104 can be configured to reflect an amount greater than about 20% of incident light, an amount greater than about 30% of incident light, an amount greater than about 40% of incident light, an amount greater than about 50% of incident light, an amount greater than about 60% of incident light, an amount greater than about 75% of incident light, an amount greater than about 85% of incident light, an amount greater than about 95% of incident light, an amount less than about 99% of incident light, or any range or combination of ranges between any of these values. The broadband mirror 104 can be configured to provide significant reflection (e.g., between about 1%-99.9%) across the full wavelength tuning range of the tunable laser. Without any loss of generality, the broadband mirror 104 is not considered to be a sampled grating distributed Bragg reflector. Without any loss of generality, the bandwidth of the spectral reflectivity of the broadband mirror 104 can be substantially greater (e.g., greater than or equal to 10 nm, greater than or equal to 20 nm, greater than or equal to 30 nm, greater than or equal to 50 nm) than bandwidth of the spectral reflectivity of a sampled grating distributed Bragg reflector.

In various embodiments, the comb mirror 103 can be a periodically chirped reflector or a superstructure grating or mirror. In some embodiments, the comb mirror 103 can comprise a sampled grating distributed Bragg reflector. The comb mirror 103 can have a reflectivity between about 0.01% and about 99.9% for incident light having a reflective wavelength in the operating wavelength range of the tunable laser. The comb mirror 103 has a plurality of reflection peaks in the operating wavelength range of the tunable laser. Each reflection peak can have a maximum reflection at a wavelength in the operating wavelength range of the tunable laser and a bandwidth given by the spectral width of the individual reflection peak at half the maximum reflection. The wavelength at which the maximum of an individual reflection peak occurs can be tuned electrically or thermally. For example, the wavelength at which the maximum of an individual reflection peak occurs can be changed by changing the temperature of the comb mirror 103 or by providing an electrical current or electrical voltage to the comb mirror 103. The bandwidth of an individual reflection peak can be in a range between about 0.001 nm and about 10 nm, between about 0.01 nm and about 5 nm, between about 0.05 nm and about 4 nm, between about 0.1 nm and about 3 nm, between about 0.2 nm and about 2.5 nm, between about 0.5 nm and about 2.0 nm, between about 0.7 nm and about 1.0 nm, or any value in a range/sub-range formed by these values.

The distance between consecution reflection peaks of the comb mirror 103 is referred to as free spectral range (FSR).

The FSR can be between about 0.05 nm and about 50 nm, between about 0.1 nm and about 30 nm, between about 0.1 nm and about 1 nm, between about 0.2 nm and about 10 nm, between about 0.3 nm and about 15 nm, between about 0.5 nm and about 15 nm, a value in any range/sub-range formed by any of these values. The laser cavity formed by the comb mirror 103 and the broadband mirror 104 has a plurality of cavity modes. In various embodiments, the laser cavity can be configured such that a non-integer number of cavity modes may fit into a single free spectral range (distance between two consecutive reflection peaks) of the comb mirror 103. Without any loss of generality, when the laser cavity is configured such that a non-integer number of cavity modes are present between two consecutive reflection peaks of the comb mirror 103, different cavity modes would overlap with different portions of consecutive reflection peaks of the comb mirror 103. Accordingly, in many embodiments of the innovative tunable laser comprising a comb mirror, different cavity modes selected by consecutive reflection peaks of the comb mirror would not be able to simultaneously lase. Without any loss of generality, the optical path length of the laser cavity can be configured such that a non-integer number of cavity modes may fit into a single free spectral range (distance between two consecutive reflection peaks) of the comb mirror 103. In various embodiments, the comb mirror 103 can be a sampled grating distributed Bragg reflector (SGDBR).

The broadband mirror 104 can be configured as a front or a back mirror of the laser device. Similarly, the comb mirror 103 can be configured as a front or a back mirror. In various embodiments, the front mirror has a reflectivity configured to allow a portion of the laser signal to be output through the front mirror. For example, the front mirror can have a reflectivity between about 0.1% and about 99%, between about 0.1% and about 60%, between about 1% and about 80%, between about 5% and about 70%, between about 10% and about 65%, between about 20% and about 60%, or any value in a range/sub-range defined by any of these values so as to allow output a portion of the laser signal through the front mirror. Other values outside this range are also possible. Various embodiments may make use of the laser signal from either end of the laser, or in some applications from both ends simultaneously.

As discussed above, the wavelengths at which the reflectivity of the plurality of reflection peaks of comb mirror 103 have a maximum value can be tuned such as, for example by providing an electric current and/or electrical voltage through an electrical contact associated with the comb mirror 103. In this manner, the comb mirror 103 is configured to select one or more of the cavity modes to generate a laser signal at a desired wavelength. Without any loss of generality, tuning the comb mirror 103 can result in movement of at least one of the reflection peaks across the cavity modes such that at least one of the cavity modes overlaps with the at least one of the reflection peaks. In some embodiments, heater pads or liquid crystal with electrodes configured to apply voltage across the liquid crystal can be associated with the comb mirror 103 and used to tune the FSR of the comb mirror 103. Various embodiments of heater pads include disposing a resistive metallic strip over the comb mirror 103, and applying an electric current through the resistive strip resulting in local heating which ultimately results in tuning of the comb mirror. Various parameters (e.g., length of the cavity, reflectivity of the comb mirror 103 and/or the broadband mirror 104) can be adjusted such that the cavity modes are spaced wide enough apart to obtain a laser signal with a single mode having side mode suppression ratio (SMSR) greater than about 20 dB (e.g., about 30 dB, about 40 dB, about 50 dB, etc. or any range formed by any of these values). In various embodiments, the output signal from the laser can have a SMSR between about 10 dB and about 150 dB, between about 30 dB and about 140 dB, between about 40 dB and about 120 dB, between about 50 dB and about 110 dB, between about 60 dB and about 100 dB, between about 70 dB and about 90 dB or any range or a combination of ranges between any of these value.

The laser cavity formed by the broadband mirror 104 and the comb mirror 103 can include an optional phase section 101 to help manipulate the cavity mode placement. The phase section 101 can be configured to effect a change in the optical path length of the optical signal in the cavity. In various embodiments, electrical current or an electrical voltage can be applied to the phase section 101 through electrical contacts (e.g., in proximity to the phase section) to alter the optical path length of the optical signal in the laser cavity. In some embodiments, the optical path length of the optical signal in the laser cavity can be changed by effecting a temperature change in the phase section 101. A temperature change in the phase section 101 can be caused, for example, by applying an electric current through a resistive strip disposed with respect to the phase section 101.

In various embodiments, the phase section 101 can be disposed between the gain region 102 and the comb mirror 103, and in some embodiments the phase section 101 can be within the gain region 102. Other locations are also possible. The phase section 101 is optional and in some embodiments, the phase section 101 can be omitted. In such embodiments, cavity mode tuning can be achieved either thermally (e.g., by applying an electrical current through a resistive heat strip) or through second order effects relating to carrier density or stress and strain in the gain region 102. In some embodiments, the comb mirror 103 may be pumped to induce gain either optically or electrically. In some embodiments, the gain region 102 can be divided into two or more portions by providing additional reflectors (e.g., reflector 105) in the gain region 102 as shown in FIG. 2. In the embodiment depicted in FIG. 2, the reflector 105 is placed in the phase section 101. However, in other embodiments, the reflector 105 can be disposed in the gain region 102. The reflectivity of the reflector 105 can be in a range between about 1% and about 50% in the wavelength range of operation of the laser 200. The reflector 105 may advantageously increase the effective free spectral range (FSR) of dominant cavity modes.

Yet another embodiment of the innovative tunable laser comprising a comb mirror incorporates Y-branch laser technology as shown in FIG. 3. The embodiment of the tunable laser 300 depicted in FIG. 3 can be configured as a dual output laser. The dual output laser comprises a first waveguide comprising a single comb mirror 103 coupled to a second waveguide comprising the phase section 101 and a third waveguide comprising the gain section 102. A broadband mirror 104 is disposed at the ends of the second and the third waveguides opposite the comb mirror 103 as shown in FIG. 3. The two broadband mirrors 104 may or may not be HR (highly reflective). In various embodiments, the two broadband mirrors 104 can comprise high reflective coatings. The embodiment of the Y-branch laser 300 illustrated in FIG. 3 can be modified in various ways. For example, in some embodiments, the second waveguide need not comprise a phase section. As another example, in some embodiments, the second waveguide can comprise an additional gain region. As another example, the first and the second waveguides can comprise additional gain regions. As yet another example, the first and/or the third waveguides can comprise additional phase sections. In some embodiments, the Y-branch laser can comprise a broadband mirror 104 disposed at an end of the first waveguide and two comb mirrors 103 disposed at the ends of the second and third waveguides. In some such embodiments, the two comb mirrors 103 can be identical. For example, both the comb mirrors 103 can have the same reflectivity and/or the same FSR. In some other embodiments, the two comb mirrors 103 need not be identical. For example, the two comb mirrors 103 can have different reflectivities and/or different FSRs. In some embodiments, all of the first, second and third waveguides may include a gain region similar to the gain region (102). Many other variations are possible.

The innovative tunable laser comprising a comb mirror described herein can be designed to operate in wavelength ranges between about 600 nm and about 1900 nm, less than 600 nm, greater than 1900 nm where spontaneous emission and stimulated emission are available. Embodiments of the innovative tunable laser comprising a comb mirror discussed herein can be fabricated from a variety of materials including but not limited to III-V semiconductor materials such as InP, GaAs, InGaAP, InAlAsP, GaN; erbium doped glasses; Silicon Germanium, and other laser materials. Embodiments of the innovative tunable laser comprising a comb mirror discussed herein can also comprise hybrid combinations of materials, for example, by butt-coupling or wafer bonding gain material to other active or passive material. Various implementations of the innovative tunable laser comprising a comb mirror described herein can be fabricated by monolithically integrating the gain region, the optional phase section, and the comb mirror on a substrate comprising a waveguide layer. The substrate can be a crystalline substrate. In some embodiments, the substrate can comprise a semiconductor material.

The radiation emitted from the gain region 102 when the tunable laser is not configured to lase can have a peak with a maximum gain value and a bandwidth which is equal to the spectral width at which the gain is half the maximum gain value. Without any loss generality, the bandwidth of the gain peak can be greater than the FSR of the comb mirror as shown in FIG. 5E. Without any loss of generality, the bandwidth of the gain peak can be wide enough to accommodate two or more reflection peaks of the comb mirror 103. For example, the bandwidth of the gain peak can be wide enough to accommodate at least 3, at least 4, at least 5, at least 10 reflection peaks, at least 20 reflection peaks, at least 30 reflection peaks or any ranges between any of these values of the comb mirror 103. In some implementations, the bandwidth of the gain peak can be wide enough to accommodate at least 1 reflection peak of the comb mirror 103.

In various embodiments, the gain region 102 can extend into the comb mirror 103. In some embodiments, the comb mirror 103 can be formed in the gain region 102. In some implementations of the tunable laser the comb mirror 103 can comprise an additional gain material different from the gain medium in the gain region 102. The additional gain material can be distributed through the entire length of the comb mirror 103 or distributed in one or more sections. The one or more sections of the comb mirror 103 can be separate from the gain region 102 as shown in FIG. 4A. The one or more sections of the comb mirror 103 comprising the additional gain material can be periodic as shown in FIG. 4A or non-periodic. The additional gain material can be the same as the material of the gain region 102 or different from the material of the gain region 102. As another example, the gain region 102 can comprise the comb mirror 103. Including gain in the mirror region can advantageously reduce the FWHM of the reflection peaks of the comb mirror 103 which can advantageously allow higher selectivity between cavity modes. Reducing the FWHM of the reflection peaks of the comb mirror 103 can also result in the tunable laser having a larger tuning range with more comb peaks. The existence of more comb peaks can allow for individual cavity modes to be independently selected. In some such implementations of the tunable laser, thermal tuning can be used to tune the comb mirror 103. In some implementations one or more sections of the comb mirror 103 can include gain medium and one or more other sections of the comb mirror 103 can be devoid of gain medium. For example, a tunable laser comprising a comb mirror can comprise one or more sections having gain medium and one or more section without gain medium. In such implementations the comb mirror can be provided with two or more electrical contacts, one or more electrical contacts for injecting current into the gain medium and one or more other contacts for injecting current into the portions of the comb mirror not including gain medium to accomplish wavelength tuning.

FIG. 4A illustrates an implementation of a laser comprising a comb mirror 103 with one or more sections comprising gain medium and one or more sections without gain medium. In the implementation illustrated in FIG. 4A, the comb mirror 103 comprises a plurality of mirror bursts (or a plurality of spaced apart reflective regions) with gain sections provided between the mirror bursts. Alternately, the gain medium can be distributed through the entire length of the comb mirror 103. In the implementation illustrated in FIG. 4A, gain medium is periodically introduced throughout the comb mirror 103. The laser can be provided with one or more electrical contact regions to provide electrical current or voltage to different portions of the laser. FIG. 4B is an example of a mask layer that can be used to fabricate portions of the laser illustrated in FIG. 4A. The mask layer shown in FIG. 4B comprises a phase contact section 101c at left configured to provide electrical current or voltage to the phase section 101, a gain contact section 102c configured to provide electrical current or voltage to the gain region, and a comb mirror gain contact region 103ac configured to provide electrical current or voltage to the optically active sections of the comb mirror 103 that comprise a gain medium and a comb mirror tuning contact region 103pc to provide electrical current or voltage to the optically passive regions of the comb mirror 103. The lengths of the gain, mirror and phase sections illustrated in FIG. 4B may vary and be significantly different from the example shown here. Likewise, the number of mirror bursts in the comb mirror shown in FIG. 4B may vary significantly. As discussed above, one or more heaters can be used for wavelength tuning the laser of FIG. 4A instead of or in addition to injection current.

Operation of the Innovative Tunable Laser Comprising a Comb Mirror

Wavelength tuning in various embodiments of the innovative tunable laser comprising a comb mirror at one end and a broadband reflector at the other end as described herein can be accomplished by moving the reflection peaks of the comb mirror to select different cavity modes of the laser. For example, at least one of the reflection peaks of the comb mirror can be moved to select one of the cavity modes. To achieve continuous tuning, at least one of the reflection peaks of the comb mirror is capable of being moved by an amount greater than or equal to the distance between consecutive reflection peaks (also referred to as free spectral range (FSR)) of the comb mirror. In contrast, wavelength tuning in implementations of a sampled grating distributed Bragg reflector (SGDBR) laser comprising two sampled grating distributed Bragg reflectors (SGDBRs) at both ends of a laser cavity is accomplished by Vernier tuning of the two sampled grating distributed Bragg reflectors. In embodiments of a coupled cavity laser, wavelength tuning can be accomplished by Vernier tuning of cavity modes. Embodiments of the innovative tunable laser comprising a comb mirror at one end and a broadband reflector at the other end as described herein can be tuned using two tuning controls—for example, one tuning control for a phase section and a second tuning control for a mirror section instead of three tuning controls—for example, one tuning control for a phase section and two tuning controls for mirror sections that are used to achieve wavelength tuning in implementations of a SGDBR laser comprising two sampled grating distributed Bragg reflectors (SGDBRs) at both ends of a laser cavity. Reducing the number of tuning controls can be advantageous in reducing the complexity of operating the device and can also simplify packaging. Moreover, with one less section to control, there is an opportunity to reduce the footprint size and/or the power consumption of the semiconductor laser device.

The tuning operation of an embodiment of the innovative tunable laser comprising a comb mirror contemplated here is shown in FIGS. 5A-5E. FIG. 5A illustrates the cavity modes of the laser cavity of the innovative tunable laser comprising a comb mirror. FIG. 5B illustrates the reflection peaks of the comb mirror. As discussed above, the laser cavity can be configured such that the spacing between the cavity modes relative to the spacing between the reflection peaks of the comb mirror can be controlled to ensure that the nearest neighbors to a selected cavity mode are significantly suppressed. FIGS. 5A and 5B illustrate an example of a tunable laser with laser cavity and the comb mirror configured to allow approximately 6.8 cavity modes between individual reflection peaks (or FSR) of the comb mirror. As a result, if a cavity mode lines up with a first reflection peak of the comb mirror, another cavity mode would line up with a sixth reflection peak as shown in FIG. 5C. Lasing occurs where cavity mode lines up with mirror comb corresponding to the left and right most modes in FIG. 5C. The bandwidth of the gain peak of the gain region of the laser can be broad relative to the FSR of the comb mirror and can accommodate 2 or more reflectance peaks of the comb mirror within the gain bandwidth of the gain region (e.g., gain region 102) as shown in FIG. 5D. Accordingly, the bandwidth of the gain peak does not drive the selection between adjacent competing reflection peaks of the comb mirror. The competition between two or more dominant modes that are spaced apart by the five times the FSR is achieved by the roll off of the gain curve and/or the response of the individual reflection peak. Accordingly, only one cavity mode that overlaps with the reflection peak of the comb mirror and occurs near the maximum of the gain peak lases as shown in FIG. 5E.

The tuning of the mirror and phase section can in some embodiments be achieved electrically or thermally, and the gain in the laser gain section can in some embodiments be achieved electrically or through optical pumping.

The tuning operation of the innovative tunable laser comprising a comb mirror discussed herein is significantly different from other existing lasers (e.g., the SGDBR laser). As discussed above, wavelength tuning in various embodiments of the tunable laser comprising a comb mirror discussed herein is accomplished by a Vernier effect between the FSR of the reflection peaks and the cavity modes. The cavity modes in various embodiments of the innovative tunable laser comprising a comb can be tuned over a small wavelength range by the phase section. In contrast, the comb mirrors can be tuned over a large wavelength. Accordingly, the mirror comb can be tuned over most of the available index tuning range, minus half a cavity mode spacing. Continuous tuning in the innovative tunable laser comprising a comb mirror can be achieved using a mirror comb with FSR that is substantially close to the index tuning range. In contrast, the comb spacing may be denser in a SGDBR tunable laser to allow for full tuning of one mirror comb spacing plus half the width of the comb of the other mirror. The wavelength maps from innovative tunable laser comprising a comb mirror show a constant hopping between the modes of the comb mirror, before repeating back to the first mirror comb on the next available cavity mode as depicted in FIG. 7. This operation is different from the mode selection and tuning process of a SGDBR laser. Furthermore, the design of the innovative tunable laser comprising a comb mirror is different from a conventional SGDBR laser, with different rules pertaining to the design of the mirror, and a different set of constraints on the design of the cavity length vs the design of the mirror.

For comparison, FIGS. 6A-6D describes the mode selection process for tuning in an SGDBR laser comprising two SGDBRs. The spacing between individual reflection peaks of the first SGDBR (e.g., front SGDBR) can be different from the spacing between individual reflection peaks of the second SGDBR (e.g., rear SGDBR) as shown in FIGS. 6A and 6B. The two SGDBRs with slightly different spacing between individual reflection peaks are tuned to achieve wavelength tuning. When a comb peak from each mirror is aligned with a comb peak from the other, lasing can occur as shown in FIGS. 6C and 6D. FIG. 6D shows two lasing modes that would be down selected by gain spectrum or mirror strength envelope. The selection process is dominated by the interplay of two comb mirrors and their relative alignment to one another.

Example Wavelength Map of the Innovative Tunable Laser Comprising a Comb Mirror

A section of a tuning map generated by simulating the operation of the innovative tunable laser comprising a comb mirror discussed herein is shown in FIG. 7 below. Although, the tuning map in FIG. 7 is in the wavelength range between about 1620 nm and about 1680 nm, the innovative tunable laser comprising a comb mirror can be designed to operate in other wavelength ranges between about 600 nm and about 1900 nm, less than 600 nm, greater than 1900 nm or in other wavelength ranges where spontaneous emission and stimulated emission are available.

The simulation shown in FIG. 7 is obtained by using a simple model based on the tuning mechanism discussed above with reference to FIGS. 5A-5E considering the interaction between the reflection peaks of the comb mirror, the cavity modes and the gain bandwidth. The simulation does not include other physical phenomena such as four wave mixing, threshold variation affecting carrier density and cavity index, the alpha parameter etc. which can affect the wavelength tuning map. Some designs may exhibit "stickiness" of modes due to four wave mixing or other nonlinear or linear effects, or hysteresis in tuning due to alpha parameter, four wave mixing or other nonlinear or linear effects. In some cases the hysteresis and mode sticking effects may be useful to the stability and predicable tuning of these devices. Accordingly, the wavelength maps of such designs may be different from the wavelength map shown in FIG. 7. However, in those embodiments of the innovative tunable laser comprising a comb mirror in which the effects of other physical phenomena such as four wave mixing, threshold variation affecting carrier density and cavity index, the alpha parameter etc. are reduced, the wavelength map may be similar to the wavelength map shown in FIG. 7. The existence of hysteresis may in some cases mean that direction of tuning on the map is related to wavelength accessibility. The simulated wavelength map shown in FIG. 7 is obtained by using only two controls—tuning the phase section to tune the cavity modes and tuning the comb mirror to tune the reflection peaks. Accordingly, the wavelength map iterates repeatedly across multiple comb modes, using different cavity modes for each iteration. The innovative tunable laser comprising a comb mirror can be continuously tuned to select any wavelength in a desired operating range using one or two controls—e.g., phase section to tune the cavity modes and tuning the comb mirror to tune the reflection peaks. As used herein continuous tuning refers to the ability to configure the laser to operate at any wavelength in a wavelength range by appropriate selection of laser parameters, such as, for example, current or voltage to the gain regions, current or voltage to the phase section and current or voltage to the comb mirror.

Example Early Prototype Data

Some wavelength maps from early prototypes of the innovative tunable laser comprising a comb mirror are shown in FIGS. 8A-1, 8A-2, 9A, 9B-1 and 9B-2. These wavelength maps show multiple continuous wavelength spans selected by combination of a mirror comb peak and cavity mode on the wavelength map. The interleaving of super-modes can also occur in part as a result of second order processes including thermal and nonlinear effects. Tuning continuity in these designs is in some cases compromised by mode sticking or other second order effects. These examples are included to show the presence in some embodiments of second order effects and other non-linear processes that can lead to maps useful but different from the simulated wavelength map shown in FIG. 7.

FIG. 8A-1 is a wavelength tuning map obtained by varying the electrical current to the comb mirror and the phase section. The FSR of the comb mirror and the cavity modes were configured to provide approximately 20 nm of wavelength tuning as shown in the wavelength histogram shown in FIG. 8A-2. FIG. 9A shows the spectrum of light output from an embodiment of a tunable laser comprising a comb mirror for different operating conditions. As seen from the wavelength spectra 901, 903, 905, 907, 909, 911 and 913, a side mode suppression ratio (SMSR) greater than about 30 dB is achieved for various operating conditions of the embodiment of the innovative tunable laser comprising a comb mirror. The different operating conditions of the innovative tunable laser comprising a comb mirror are characterized by different values of phase and comb mirror currents. FIG. 9B-1 illustrates the wavelength map between 1620 nm and 1650 nm for the embodiment of the innovative tunable laser comprising a comb mirror and FIG. 9B-2 is a wavelength histogram corresponding to the wavelength map of FIG. 9B-1. As noted above, the different color streaks in the wavelength map shown in FIG. 9B-1 correspond to non-adjacent cavity modes that are tuned continuously when selected by the mirror.

As the current applied to the comb mirror of the innovative tunable laser comprising a comb mirror is increased, the wavelengths of light output from the innovative tunable laser comprising a comb mirror cycle through wavelengths that are defined primarily by spacing of the mirror comb. One cycle may not result in a continuous tuning range, however, the tunable laser can be configured such that this series of comb modes can be repeated for multiple adjacent cavity modes as the mirror is further tuned and cycled through the mirror peaks. A continuous tuning range can be achieved this way if desired, as shown in FIGS. 9B-1 and 9B-2.

In contrast, the wavelength map obtained for an embodiment of a SGDBR laser illustrated in FIG. 10 is different from the wavelength map shown in FIG. 9B-1. A SGDBR laser transitions through each mirror reflection peak in sequence and the combined tuning of two mirrors, allows quasi-continuous tuning across wavelength ranges that include multiple cavity mode hops along the way. To achieve continuous wavelength tuning in a SGDBR laser, would require tuning the phase section of the SGDBR in addition to the combined tuning of the two mirrors. In contrast, tuning the comb mirror and the phase section can achieve continuous wavelength tuning in the innovative tunable laser comprising a comb mirror. The difference between the tuning mechanisms is clear in that the color of the wavelength maps of FIG. 9B-1 and FIG. 10. The wavelength map for an embodiment of the tunable laser comprising a comb mirror illustrated in FIG. 9B-1 repeatedly cycles from left to right, gradually changing shade, whereas the wavelength map for an embodiment of a SGDBR laser illustrated in FIG. 10, the full tuning range is accessible within a single cycle of tuning the two mirrors with respect to each other over the entire tuning range. The tuning map for the implementation of the SGDBR laser hops in wavelength from cavity mode to cavity mode leaving wavelength gaps. In contrast, the innovative tunable laser comprising a comb mirror has the advantage of being able to display fully continuous wavelength range, without the wavelength gaps found in the wavelength map of the implementation of the SGDBR laser.

Sampled Grating Distributed Bragg Reflector Laser

Another innovative aspect contemplated in this application is embodied in a laser structure comprising a gain region comprising optically active material disposed within a cavity formed by partially reflecting or a highly reflecting mirror on one end of the cavity and a sampled grating distributed Bragg reflector (SGDBR) on another end of the cavity. Such laser structures can have several advantages over a conventional Distributed Bragg Reflector (DBR) Laser as discussed below.

A conventional DBR laser comprises a grating reflector at one end of a gain medium and an at least partially reflecting element at the other end. FIG. 11, schematically illustrates an embodiment of a conventional DBR laser 1100. The DBR laser 1100 comprises a gain region 1102 comprising an optically active material. For example, the gain region 1102 can comprise multi-quantum well heterojunctions formed in semiconductor materials, such as, for example, III-V semiconductor materials. A first end of the gain region 1102 can comprise a broadband reflector 1104. The broadband reflector 1104 can comprise a high reflection (HR) coating, a partially reflecting (PR) coating or can be uncoated. The broadband reflector 1104 can have characteristics similar to the characteristics of the broadband mirror 104 discussed above. A second end of the gain region 1102 comprises a Distributed Bragg Reflector (DBR) 1103. Depending on the relative reflective strength of the DBR 1103 and the relative reflective strength of the broadband reflector 1104, either end may be viewed as the front end through which laser light is output. In various embodiments, the broadband reflector 1104 can comprise an optical facet of the DBR laser.

Some implementations of the DBR laser may further comprise a phase section 1101 positioned at either end of the gain region 1102, although it is has been chosen to be on the left side of the gain section for the embodiment illustrated in FIG. 11. The phase section 1101 can be configured to effect a change in the optical path length of the optical signal in the DBR laser cavity between the first end and the second end. In various embodiments, an electrical current or an electrical voltage can be applied to the phase section 1101 through electrical contacts (e.g., in proximity to the phase section) to alter the optical path length for the optical signal in the DBR laser cavity. In some embodiments, a temperature change in the phase section 1101 can provide a change in optical path length and consequently a change in phase of the output optical signal emitted from the DBR laser. For example, a temperature change can be introduced by applying an electric current through a resistive strip disposed with respect to the phase section 1101 to alter the optical path length of the optical signal in the cavity.

The design of the DBR 1103 can affect the quality of the optical signal emitted by the laser. For example, if the reflectance peak of the DBR has a broad spectral bandwidth (e.g., determined by the full width at half maximum of the reflection peak), the side mode suppression ratio (SMSR) will be poor or reduced (e.g., SMSR can be less than about 20 dB), and in the worst case multiple cavity modes may lase. This concept is illustrated in FIGS. 12A-12G. FIG. 12A shows the evenly spaced round trip cavity modes of a DBR laser cavity (e.g., Fabry-Perot type laser cavity). FIG. 12B illustrates a reflection peak of a first embodiment of a DBR and FIG. 12C illustrates the reflection peak of a second embodiment of a DBR. The first embodiment of a DBR is configured to produce a first reflection peak with a first spectral bandwidth and the second embodiment of the DBR is configured to produce a second reflection peak with a second spectral bandwidth, the second spectral bandwidth being broader than the first spectral bandwidth. The first and the second spectral bandwidths can correspond to the spectral width at 50% of the maximum of the first and second reflection peaks respectively. The first embodiment of the DBR can be configured to accommodate only one cavity mode within the first spectral bandwidth. The second embodiment of the DBR can be configured to accommodate more than one cavity mode within the second spectral bandwidth. FIGS. 12D and 12E show the overlap of the first and the second reflection peaks of the first and the second embodiments of the DBR respectively with the cavity modes of the DBR laser cavity. As noted above, only one cavity mode is selected by the first reflection peak while other cavity modes adjacent to the selected cavity mode are suppressed (e.g., attenuated by more than 50% as compared to the selected cavity mode). In contrast, a plurality of cavity modes is selected by the second reflection peak.

FIGS. 12F and 12G show the resulting lasing spectra resulting from the overlap of the first and the second reflection peaks of the first and the second embodiments of the DBR respectively with the cavity modes of the DBR laser cavity. As noted from FIGS. 12F and 12G, the spectral bandwidth of the DBR relative to the cavity mode spacing can affect the lasing behavior of the DBR laser. For example, the laser signal from a DBR laser comprising the first embodiment of the DBR having the first reflection peak with the first spectral bandwidth can have high side mode suppression ratio (SMSR) (e.g., greater than or equal to 20 dB) and high mode stability as compared to the laser signal from a DBR laser comprising the second embodiment of the DBR having the second reflection peak with the second spectral bandwidth. As another example, a DBR laser comprising the second embodiment of the DBR having the second reflection peak with the second spectral bandwidth can be configured as a multi-mode laser whereas a DBR laser comprising the first embodiment of the DBR having the first reflection peak with the first spectral bandwidth can be configured as a single-mode laser. Without any loss of generality, the DBR can be considered as a reflective filter having a filter bandwidth. Accordingly, the DBR may be referred to as a DBR filter herein and the bandwidth of the reflection peak of the DBR mirror may be referred to as a filter bandwidth. In various implementations, the reflectivity of the broadband reflector 1104 and/or the DBR 1103 comprising the DBR can be between 0.1% and about 99%. For example, the reflectivity of the broadband reflector 1104 and/or the DBR 1103 can be between 0.1% and about 2%, between 0.5% and about 3%, between about 1% and about 5%, between about 1.75% and about 10%, between about 5% and about 15%, between about 10% and about 25%, between about 25% and about 45%, between about 30% and about 60%, between about 45% and about 75%, between about 50% and about 90%, between about 75% and about 95%, between about 80% and about 97%, between about 85% and about 99%, or any combination of these ranges or in any range/sub-range defined by any of these numbers.

Higher power lasers generally can have longer cavities, e.g., to accommodate larger gain regions. The cavity mode spacing is inversely proportional to the length of the cavity and therefore the cavity modes may be tightly spaced in wavelength domain. In such embodiments of DBR with reflection peaks having very small spectral bandwidth may be used to achieve single-mode operation, providing SMSR greater than 20 dB. The spectral bandwidth of the reflection peak of a DBR is generally proportional to the coupling strength of the grating and can be modified by changing the depth of the grating or the index contrast between grating structures or the overlap of the optical mode with the grating. In various embodiments, the optical mode may be confined to a waveguide provided in a waveguide layer and the grating may be provided in a grating layer. In such embodiments, the overlap of the optical mode with the grating may depend on a position of grating layer with respect to the waveguide layer. Precise control of these parameters can be difficult. Additionally, manufacturability considerations can limit how low the coupling strength of the grating can be. Moreover, in photonic integrated circuits, multiple different devices may be desired on a single fabrication platform, and some devices may require a higher coupling coefficient (e.g. for tunable laser design) while others on the same chip may require a very narrow filter. Thus, it may be difficult to manufacture DBRs with reflection peaks with narrow spectral bandwidth that can be used to fabricate high power single-mode lasers.

These issues can all be addressed by replacing the DBR 1103 by a Sampled Grating Distributed Bragg Reflector (SGDBR) or a comb reflector. The SGDBR comprises a series of grating bursts or gratings in the optical path spaced apart from each other by a region that does not include grating structures. The length of the region comprising the individual grating bursts is referred to herein as the burst length and the length of the region that is in between consecutive grating bursts and does not include the grating bursts is referred to herein as blank length. The distance between two consecutive grating bursts is referred to as the sampling period. In some embodiments, the SGDBR can be used to design reflectors having a variety of filter bandwidths without changing the coupling strength of the grating. Without any loss of generality, in various embodiments, the SGDBR can be provided in the cavity (e.g., adjacent to the gain region 1102) or in the waveguide integrated with the gain region 1102.

The reflection peaks of the SGDBR can have relatively narrow spectral bandwidths as compared to an equivalent DBR. This is illustrated in FIGS. 13A and 13B which depicts modelled reflection spectra for a DBR and a SGDBR respectively. The DBR and the SGDBR are modelled using the same grating coupling coefficient. It is noted from FIGS. 13A and 13B that the reflectivities of the DBR and the SGDBR are similar but the Full Width Half Maximum (FWHM) of the reflection peak of the SGDBR is narrower as compared to the FWHM of the reflection peak of the DBR by approximately a factor of 5. In other words, the FWHM of the reflection peaks of the SGDBR is nearly five times smaller than the FWHM of the reflection peak of the DBR. Accordingly, the SGDBR can be used with a laser that has a longer cavity length. Depending on mirror length and the loss in the grating, the FWHM of the reflection peaks can be reduced even further for the SGDBR.

FIG. 14 shows an example of an embodiment of a single-mode laser 1400 similar to the DBR laser 1100. In the illustrated embodiment, a SGDBR 1403 is disposed at the second end instead of the DBR 1103 as a reflective filter. As discussed above, the phase section 1101 can be placed anywhere within the laser cavity formed by the broadband reflector 1104 and the SGDBR 1403. For example, the phase section can be placed in the center of the laser cavity, near the optical facet 1101, or near the SGDBR 1403. In various implementations, the reflectivity of the broadband reflector 1104 (comprising a partially reflecting coating, a highly reflecting coating, or no coating) and/or the SGDBR 1403 can be between 0.1% and about 99%. For example, the reflectivity of the broadband reflector 1104 and/or the SGDBR 1403 can be between 0.1% and about 2%, between 0.5% and about 3%, between about 1% and about 5%, between about 1.75% and about 10%, between about 5% and about 15%, between about 10% and about 25%, between about 25% and about 45%, between about 30% and about 60%, between about 45% and about 75%, between about 50% and about 90%, between about 75% and about 95%, between about 80% and about 97%, between about 85% and about 99%, or any combination of these ranges or any range/sub-range defined by any of these numbers. In various implementations, the SGDBR 1403 can comprise chirped grating structures. For example, each individual grating burst can comprise chirped gratings. As another example, the SGDBR 1403 can comprise periodically chirped gratings. As yet another example, the SGDBR 1403 can comprise grating bursts of progressively changing size. Without any loss of generality, the multiple reflection peaks of the SGDBR 1403 are configured to be wide enough to allow for single mode operation of the laser using the bandwidth of the laser and the envelope of the mirror comb to reduce or mitigate multimode lasing.

The mechanism for single mode lasing of the embodiment of laser device 1400 depicted in FIG. 14 is shown in FIGS. 15A-15D. FIG. 15A shows the cavity modes of the laser cavity comprising a broadband reflector and a SGDBR. FIG. 15B shows the reflectance peaks of the SGDBR 1403. FIG. 15C shows the gain curve of the laser cavity formed by the broadband reflector 1104 and the SGDBR 1403 and FIG. 15D shows the resulting lasing mode. The cavity modes are sampled at multiple wavelengths by the SGDBR/reflective mirror comb, which is in turn is sampled by the gain curve which results in a single lasing mode with good side mode suppression ratio (SMSR). The spectral range in which the laser can operate efficiently corresponds to the region of the gain curve that has significant gain (e.g., gain greater than or equal to about 30% of the maximum gain). The region of the gain curve that has significant gain can also be referred to as gain bandwidth. The gain bandwidth can be measured as the wavelength range over which the gain is greater than or equal to about 90% of the maximum gain, the wavelength range over which the gain is greater than or equal to about 80% of the maximum gain, the wavelength range over which the gain is greater than or equal to about 70% of the maximum gain, the wavelength range over which the gain is greater than or equal to about 60% of the maximum gain, the wavelength range over which the gain is greater than or equal to about 50% of the maximum gain, the wavelength range over which the gain is greater than or equal to about 40% of the maximum gain, the wavelength range over which the gain is greater than or equal to about 30% of the maximum gain, etc.

The SGDBR 1403 can be tuned such that the reflectance peak of the SGDBR 1403 in the gain bandwidth overlaps with one or more of the cavity modes thereby selecting the one or more cavity modes in the region of the gain curve that has significant gain. The phase section 1101 can also be tuned so that one or more cavity modes are selected by the SGDBR mirror in the region of the gain curve that has significant gain. The SGDBR 1403 and/or the phase section 1101 can be tuned by supplying electrical current or voltage through an electrical contact disposed with respect to the SGDBR 1403 and/or the phase section 1101. In some embodiments, a temperature change can be introduced into the SGDBR 1403 and/or phase section 1101 by applying an electric current through a resistive strip disposed with respect to the SGDBR 1403 and/or phase section 1101 to alter the optical path length and tune the SGDBR mirror 1403 and/or phase section 1101 thereby translating the reflectance peak of the SGDBR 1403 with respect to the cavity modes. The SGDBR 1403 can have multiple reflection peaks in the wavelength space of the cavity modes. For example, as shown in FIG. 15B, three reflection peaks of the SGDBR 1403 correspond with three cavity modes at three different wavelengths in the wavelength space of the cavity modes shown in FIG. 15A. The reflectance peak of the SGDBR 1403 that corresponds to the region of the gain curve having significant gain contributes to lasing as shown in FIG. 15D. In this embodiments, the bandwidth of the reflectance peak of the SGDBR 1403 is configured such that only one cavity mode is selected to achieve single-mode operation with high SMSR as shown in FIG. 15D. The wavelength of the laser depicted in FIG. 15D can be tuned in a small wavelength range (e.g., a wavelength less than about 12 nm) around the peak of the gain curve by tuning the SGDBR 1403 to shift the position of the reflectance peak to select another cavity mode.

One of the factors that contribute to stable single mode operation of the embodiment of the laser device depicted in FIG. 14 is the distance between consecutive reflectance peaks also referred to as Free Spectral Range (FSR) of the SGDBR 1403. To achieve stable single-mode operations, the spacing between the reflectance peaks of the SGDBR 1403 is large enough so that only one of the reflectance peak falls in the portion of the gain curve with significant gain while the other reflectance peaks are at wavelengths that have little to no gain. Thus, cavity modes that are in the vicinity of the gain peak will lase. In III-V materials such as InP or GaAs, the region of the gain curve that has significant gain (e.g., greater than or equal to about 30% of the maximum gain of the gain peak) can be about 30 nm or more. Accordingly, in certain embodiments of lasers comprising III-V materials, the FSR of the SGDBR 1403 can be larger than about 15 nm or more to provide stable single-mode operation. The FSR of the SGDBR 1403 can be tailored for other materials such that only one reflectance peak falls in the region of the gain curve that has significant gain. In various implementations, the FSR of the SGDBR 1403 can be tailored by varying/selecting parameters of the SGDBR 1403 including but not limited to the effective length of the SGDBR 1403, the burst length and/or the blank lengths, etc. This is substantially different from a widely tunable SGDBR laser which comprises two SGDBRs at either end of the gain region and can be tuned over a wavelength range greater than about 20 nm. In implementations of the widely tunable SGDBR lasers, each SGDBR mirror can have an FSR that is about ⅔ the attainable tuning range of the mirror, (e.g. about 6 nm for 1550 nm designs on InP).

An alternative or additional approach for ensuring single mode operation of the implementation depicted in FIG. 14 is to design the SGDBR comb mirror so that the reflection envelope is relatively narrow and only one of the reflection peaks in the comb is dominant (e.g., one reflectance peak has a reflection magnitude that is at least 20% greater than reflection magnitude of other peaks) as shown in FIG. 16B. This can be accomplished by using larger burst lengths in the grating. For example, SGDBRs with burst lengths greater than about 10 microns have a relatively narrow reflection envelope with respect to the gain bandwidth as compared to the reflection envelope provided by SGDBRs with burst lengths of about 1 micron. FIG. 16A shows the cavity modes of a laser cavity comprising a broadband reflector and a SGDBR comb mirror having a reflection envelope as shown in FIG. 16B. FIG. 16C depicts the gain curve of the gain medium disposed in the laser cavity. FIG. 16D shows the resulting lasing spectra of an embodiment of a laser comprising a broadband reflector and a SGDBR with a reflection envelope as shown in FIG. 16B. A laser comprising a SGDBR/comb mirror with reflection comb that decays in reflection magnitude from a central reflection peak can provide a functional single mode design with a relatively narrow reflection envelope as compared to the gain bandwidth.

A laser comprising a SGDBR mirror designed to have a reflectance comb with one dominant reflectance peak (e.g., one peak having a reflectance magnitude that is at least 20% greater than reflectance magnitude of other reflectance peaks) as shown in FIG. 16B is substantially different from a widely tunable SGDBR laser in that a single reflection peak near the center of the SGDBR reflection envelope has significantly higher reflection than adjacent reflection peaks, resulting in a lower threshold gain so that other reflection peaks cannot compete as lasing modes. In contrast, in a widely tunable laser design (which can be tuned over a wavelength range greater than about 20 nm), the reflection envelopes for both mirrors may be broad so that multiple reflection peaks have competitive reflection strengths.

The Full Width Half Maximum (FWHM) of at least one of the reflectance peaks of the SGDBR 1403 in the implementation depicted in FIG. 14 is configured to achieve single-mode operation. If the FWHM of at least one of the reflectance peaks of the SGDBR 1403 is narrow (e.g., less than about 0.05 times cavity mode spacing), then it may not be practically possible to avoid mode-hopping to other comb peaks as the phase section is tuned. A possible reason for this can be that at certain points in phase space, the other comb peaks may be much better centered over a cavity mode and may dominate despite having significantly lower gain, because of higher effective reflectivity of the SGDBR mirror and corresponding lower threshold gain. Conversely, if the FWHM of at least one of the reflectance peaks of the SGDBR 1403 is broad (greater than about 7 times cavity mode spacing) the laser may become unstable as multiple adjacent cavity modes can compete within the dominant reflection peak. Accordingly, in various embodiments, the FWHM of at least one of the reflection peaks of the SGDBR 1403 can be greater than or equal to about 0.05 times cavity mode spacing and less than or equal to about 7 times cavity mode spacing, greater than or equal to about 0.1 times cavity mode spacing and less than or equal to about 6.5 times cavity mode spacing, greater than or equal to about 0.2 times cavity mode spacing and less than or equal to about 6 times cavity mode spacing, greater than or equal to about 0.5 times cavity mode spacing and less than or equal to about 5.75 times cavity mode spacing, greater than or equal to about 0.75 times cavity mode spacing and less than or equal to about 5.25 times cavity mode spacing, greater than or equal to about 1 times cavity mode spacing and less than or equal to about 5 times cavity mode spacing, greater than or equal to about 1.25 times cavity mode spacing and less than or equal to about 4.5 times cavity mode spacing, greater than or equal to about 1.5 times cavity mode spacing and less than or equal to about 4 times cavity mode spacing, greater than or equal to about 2 times cavity mode spacing and less than or equal to about 3.5 times cavity mode spacing, or in any range/sub-range defined by any of these values. Any of the FWHM, reflectivity and FSR of the reflection peaks of the SGDBR 1403 can be tailored by varying parameters including but not limited to the effective length of the SGDBR 1403, the burst length and/or the blank lengths, etc. Without any loss of generality, the FWHM of the various reflectance peaks of the SGDBR 1403 can be substantially equal to each other.

Advanced numerical modelling techniques can be used potentially to attain the effective cavity mode spacing, which includes the effects of not just the gain and phase length, but also the effective length of the mirror itself. The longer the cavity length, the narrower the FWHM of the reflective peaks of the SGDBR will be in some designs. The placement of the reflectance peak of the SGDBR relative to the gain curve can in some embodiments be controlled by controlling the blank length and/or the sampling period. Long laser cavities can be advantageous to achieve high output powers. However, the spacing between consecutive cavity modes can be small in lasers with long cavities. Accordingly, in lasers with long cavities, SGDBRs with reflection peaks having small FWHM may be used to achieve stable operation. SGDBRs having reflection peaks with small FWHM may be realized by increasing the sampling period. The result of a larger sampling period is that the comb is more tightly spaced and the FWHM of the reflection peaks is smaller which in turn is useful for stable operation. However, if the reflection peak of the SGDBR 1403 of the implementation illustrated in FIG. 14 is configured to have very small bandwidth, the laser may become multimode as the FSR of the SGDBR may be reduced and many comb peaks can be on or near the gain peak and compete with one another. By replacing the broadband reflector 1104 of FIG. 14 with a DBR mirror or other narrow band reflective filter, a single peak can be selected. Such an implementation is depicted in FIG. 17.

The implementation of a laser 1700 shown in FIG. 17 comprises a gain region 1102 disposed in a laser cavity formed between a DBR 1704 and a SGDBR 1703. Various characteristics of the DBR 1704 can be similar to the DBR 1103 discussed above. Various characteristics of the SGDBR 1703 can be similar to the SGDBR 1403 discussed above. The DBR 1704 can be used to select a single reflective peak of the SGDBR 1703, and the selected reflective peak of the SGDBR 1403 can be used to select a single cavity mode, resulting in single mode lasing. FIGS. 18A-18D illustrate the operation of the embodiment 1700 illustrated in FIG. 17. FIG. 18A shows the cavity modes of the laser cavity of the device 1700. FIG. 18B shows the reflection peaks of the SGDBR 1703. FIG. 18C shows the reflectance peak of the DBR 1704 and FIG. 18D shows the resulting lasing mode. It is noted from FIG. 18C that the reflection peak of the DBR 1704 is configured to be in the region of the gain curve of the laser cavity that has significant gain (e.g., in the region where the gain is greater than about 30% of the maximum gain). In some embodiments, the reflection peak of the DBR 1704 may be tuned over a range less than about 12 nm in the vicinity of the gain peak. The DBR 1704 can be tuned by electrical or thermal controllers that apply electrical or thermal signal to the DBR 1704. For example, an electrical current or electrical voltage can be provided to contacts disposed with respect to the DBR 1704 to vary the position of the reflection peak in the region of the gain curve with significant gain. As another example, a temperature change in the DBR 1704 can be caused by applying an electric current through a resistive strip disposed with respect to the DBR 1704 to alter the position of the reflection peak in the region of the gain curve with significant gain.

In various implementations, the reflectivity of the DBR 1704 and/or the SGDBR 1703 can be between 0.1% and about 99%. For example, the reflectivity of the DBR 1704 and/or the SGDBR 1703 can be between 0.1% and about 2%, between 0.5% and about 3%, between about 1% and about 5%, between about 1.75% and about 10%, between about 5% and about 15%, between about 10% and about 25%, between about 25% and about 45%, between about 30% and about 60%, between about 45% and about 75%, between about 50% and about 90%, between about 75% and about 95%, between about 80% and about 97%, between about 85% and about 99%, or any combination of these ranges or in any range/sub-range defined by any of these numbers.

For efficient operation of the laser 1700 depicted in FIG. 17, the reflection peak of the DBR 1704 is configured to select only one of the reflection peaks of the SGDBR. In general, the DBR 1704 can be configured such that the reflection peak of the DBR 1704 has a FWHM greater than or equal to about 0.05 times and less than or equal to about 7 times the FSR of the SGDBR 1703. The SGDBR 1703 may be designed such that the reflectance peak of the SGDBR 1703 has a FWHM greater than or equal to about 0.05 times and less than or equal to about 7 times the cavity mode spacing. In various implementations, the SGDBR 1703 may be configured such that one of the reflection peaks of the SGDBR 1703 may coincide with the center of the Bragg wavelength of the DBR 1704. Such a design can allow operation without active tuning of the SGDBR or Bragg mirrors by temperature, injection current or other methods.

It is noted that the implementations illustrated in FIGS. 14 and 17 are only examples. The location of the phase section 1101, the reflectivities of the DBR 1704 and the SGDBRs 1403 and/or 1703, the sampling period of the SGDBRs 1403 and/or 1703, the length of the gain region 1102, etc. can be configured to achieve operation in a desired wavelength range and/or to provide a desired range of output power. The embodiments illustrated in FIGS. 14 and 17 can be electrically or thermally tuned, and individual current injection or heater pads may (or may not) be connected to one or more elements of the device for improved or optimal performance. The gain region 1102 can be optically pumped or electrically pumped by current injection and may be on any medium that provides gain including but not limited to III-V materials, doped glass materials, and Silicon or Silicon Germanium. The embodiments of laser devices shown in FIGS. 14 and 17 may also be fabricated in a hybrid configuration such as bonding III-V gain material to Silicon or glass waveguides with gratings and phase section.

Gratings of the SGDBR 1403/1703 or the DBR 1704 may be first order gratings, second order gratings, or other higher order gratings, and may have various duty cycles depending on the intended design. The gratings may also be chirped. The implementations depicted in FIGS. 14 and 17 are different from a broadly tunable SGDBR because only one SGDBR is used. In the implementation illustrated in FIG. 14, the lasing mode is selected by translating the reflection peak of the SGDBR 1403 with respect to the cavity modes. In the implementation illustrated in FIG. 17, the lasing mode is selected by selecting one of the reflection peaks of the SGDBR 1703 using the reflection peak of the DBR 1704. In contrast, a widely tunable SGDBR laser comprising two SGDBR mirrors having substantially similar FSR may rely on Vernier tuning of the two SGDBR mirrors.

The device 1400 of FIG. 14 and/or the device 1700 of FIG. 17 can comprise antireflection (AR) coatings on a side of the DBR 1703 and/or the SGDBR 1403/1703 opposite the side of the gain section. In some implementations, the antireflection (AR) coatings can be transmissive to wavelengths that are not reflected by the DBR 1703 and/or the SGDBR 1403/1703. In some designs, the AR coatings can be transmissive at the laser wavelengths and/or at wavelengths outside the laser wavelengths, such as, for example, wavelengths that are outside the 3-dB bandwidth of the reflection peak of the DBR 1703 and/or the SGDBR 1403/1703. This can be advantageous in passive optical networks (e.g., Gigabyte capable passive optical network (GPON)) that rely on a plurality of wavelengths to transport data in which unwanted reflection of wavelengths several 10s of nm away from the lasing wavelength can degrade network performance. The antireflection (AR) coatings can reduce unwanted reflection of wavelengths several 10s of nm away from the lasing wavelength. The AR coatings can be designed to be transmissive for wavelengths in a range greater than or equal to about 50 nm about the lasing wavelength, greater than or equal to about 100 nm about the lasing wavelength, greater than or equal to about 150 nm about the lasing wavelength, greater than or equal to about 200 nm about the lasing wavelength, greater than or equal to about 250 nm about the lasing wavelength, greater than or equal to about 300 nm about the lasing wavelength, greater than or equal to about 500 nm about the lasing wavelength, or ranges/sub-ranges therebetween.

The DBR 1703 and/or the SGDBR 1403/1703 can be configured to have approximate reflectivity substantially less than about 1% (e.g., less than 0.9%, less than about 0.5%, less than about 0.1%, less than about 0.01%, less than about 0.001%) at wavelengths in a wavelength range greater than or equal to about 30 nm about the reflectance peak of the DBR 1703 and/or the SGDBR 1403/1703, greater than or equal to about 40 nm about the about the reflectance peak of the DBR 1703 and/or the SGDBR 1403/1703, greater than or equal to about 100 nm about the reflectance peak of the DBR 1703 and/or the SGDBR 1403/1703, greater than or equal to about 200 nm about the reflectance peak of the DBR 1703 and/or the SGDBR 1403/1703, or ranges/subranges therebetween. Using such lasing devices can eliminate the use of an isolator to prevent stray light from the system from reflecting back into the system from the laser at wavelengths far from the lasing peak. Without any loss of generality, the AR coatings can comprise, for example, a plurality of thin films, an interference coating, one or more index matching materials, a quarter wavelength stack, or combinations thereof.

FIG. 19A shows an implementation of a laser configured to reduce unwanted reflection from wavelengths 10s of nanometers away from the lasing wavelength. The embodiment 1900 comprises a laser cavity bounded by a distributed DBR 1904 having a reflection peak at about 1525 nm and a 3-dB bandwidth of about 7 nm as shown in FIG. 19B and a comb reflector 1903 having a central reflection peak at 1525 nm and a 3-dB bandwidth of about 1.5 nm as shown in FIG. 19C. The comb mirror 1903 has secondary reflection peaks about the central reflectance peak as shown in FIG. 19C. The secondary reflection peaks can have reduced intensity as compared to the central reflection peak as shown in FIG. 19C. The DBR 1904 and the comb mirror 1903 can comprise AR coatings as discussed above. Incident light at a wavelength of about 1605 nm which is about 80 nm away from the reflection peak of DBR 1904 and the comb mirror 1903 will pass through the AR coated facets and through the DBR 1904 and the comb mirror 1903 which have substantially zero reflectance at the wavelength of about 1605 nm. In some implementations, incident light at 1605 nm can be scattered or absorbed by the AR coatings. The laser 1900 will lase successfully at about 1525 nm where the reflection peaks are high. Light at wavelengths far from the central reflection peak of 1525 nm of the DBR 1904 and the comb mirror 1903 (e.g., around 1605 nm shown in the FIGS. 19B and 19C with a vertical arrow 1905) is not reflected, or returned into the system from the laser facet or from the DBR 1904 and the comb mirror 1903, but instead pass harmlessly through the laser (as shown in FIG. 19A). Furthermore, the comb mirror 1903 and the DBR 1904 have reduced reflections at wavelengths far from the reflection peaks of the DBR 1904 and the comb mirror 1903. This can be advantageous in reducing reflection of light from the laser at wavelengths away from the reflection peaks of the DBR 1904 and the comb mirror 1903 or lasing wavelength when the implementations of the laser are part of a larger monolithically integrated photonic device/circuit.

Y branch configurations are also envisioned in which the DBR or SGDBR is split into one or more branches, or are on two branches of the same laser, as shown in FIG. 20. The embodiment 2000 illustrated in FIG. 20 comprises a first branch 2001 and a broadband reflector 2003 at one end of the first branch 2001. The first branch 2001 can comprise a gain region 2002 comprising an optically active material and/or a phase section 2004. The first branch 2001 is optically coupled to a second branch 2006 and a third branch 2008. In various embodiments, the first branch 2001, the second branch 2006 and the third branch 2008 can comprise one or more waveguides. In various embodiments, the second branch 2006 can comprise a DBR 2009. In some embodiments, the third branch 2008 can comprise a SGDBR 2010. In some embodiments, the second branch 2006 and/or the third branch 2008 can comprise an optional phase section 2011 and/or a gain region. In some such embodiments, the first branch may or may not comprise the gain region 2002 comprising an optically active material and/or a phase section 2004.

A skilled person would realize that embodiments of the Y branch laser 2000 such as depicted in FIG. 20 can be modified in a variety of ways. For example, a phase section and/or a gain section can be provided in each arm. As another example, a phase section and/or a gain section need not be provided in each arm. In some embodiments, the first branch 2001 can comprise a DBR and/or SGDBR while the second branch 2006 or the third branch 2008 comprises a broadband reflector. Some embodiments of the Y-branch laser need not include a DBR and instead comprise two broadband reflectors. In various embodiments, the SGDBR can be configured having reflectance peaks with small FWHM capable of selecting a single cavity mode, with or without a DBR. The ends of the first branch, the second branch and/or the third branch of the Y-laser can be configured as an optical facet and may or may not be coated with a high reflective coating, a partial reflective coating or antireflective coatings. In some implementations, the branches of the Y-laser comprising the DBR 2009 and/or the SGDBR 2010 can be configured as input paths of a Mach-Zehnder (MZ) type modulator that is integrated with the laser.

The implementations depicted in FIG. 14, FIG. 17 and FIG. 20 can all be monolithically integrated with a semiconductor optical amplifier (SOA), an Electroabsorption modulator (EAM) or a Mach-Zehnder (MZ) modulator or other photonic optical components to provide monolithically integrated transmitters and other photonic integrated circuits. The implementations depicted in FIG. 14, FIG. 17 and FIG. 20 can be integrated on a substrate (e.g., a semiconductor substrate, a glass substrate or a semiconductor/silicon chip) with additional components such as for example, SOAs, EAMs, MZ modulators, photodetectors, electrical/optical components referenced above or elsewhere hereinafter.

In some implementations, the DBR 1704 or the DBR 2009 of the implementations depicted in FIG. 17 or FIG. 20 can be replaced with a second SGDBR that is configured as a narrow linewidth DBR. The reflectance peaks of the second SGDBR can be spaced farther apart as compared to the spacing between the reflectance peaks of the SGDBR 1703 or SGDBR 2010. Accordingly, the FSR of the second SGDBR can be greater than the FSR of the SGDBR 1703 or SGDBR 2010. For example, the spacing between at least one pair of consecutive reflection peaks of the plurality of reflectance peaks of the second SGDBR mirror can be between about one and a half times and about 200 times the spacing between at least one pair of consecutive reflection peaks of the plurality of reflectance peaks of the SGDBR 1703 or SGDBR 2010. In various implementations, only a single reflection peak of the second SGDBR mirror may lie in the portion of the gain curve having significant gain.

FIG. 21A illustrates the reflection peaks of the SGDBR 1703 or SGDBR 2010 and FIG. 21B illustrates the reflectance peaks of the second SGDBR that would replace the DBR 1704 or the DBR 2009. The FWHM of at least one of the plurality of reflectance peaks of the second SGDBR can be less than or equal to about 7 times the FSR of the SGDBR 1703 or SGDBR 2010 and greater than or equal to about 0.1 times the FWHM of the reflectance peak of the SGDBR 1703 or SGDBR 2010. The FSR of the second SGDBR can be greater than the half of the half maximum (HWHM) of the first SGDBR mirror envelope and/or wide relative to the gain peak (e.g. >15 nm for III-V materials based on InP or GaAs). A similar result could be obtained if the DBR 1704 comprises higher order gratings (e.g. 2nd or 5th or 7th or any other higher order). In various implementations, the reflectivity of the second SGDBR can be between 0.1% and about 99%. For example, the reflectivity of the second SGDBR can be between 0.1% and about 2%, between 0.5% and about 3%, between about 1% and about 5%, between about 1.75% and about 10%, between about 5% and about 15%, between about 10% and about 25%, between about 25% and about 45%, between about 30% and about 60%, between about 45% and about 75%, between about 50% and about 90%, between about 75% and about 95%, between about 80% and about 97%, between about 85% and about 99%, or in any range/sub-range defined by any of these numbers. A laser comprising two SGDBRs at either ends of the laser cavity having reflection spectrum as shown in FIG. 21A and FIG. 21B would lase like a conventional single mode DBR laser at approximately 1650 nm.

The various implementations and/or examples of lasers described herein can be configured to operate in a wide range of wavelengths, such as, for example, between about 360 nm and about 700 nm, between about 650 nm and about 1.1 µm, between about 980 nm and about 1.3 µm, between about 1.0 µm and about 1.5 µm, between about 1.3 µm and about 3.0 µm, between about 3.0 µm and about 7.0 µm, between about 5.0 µm and about 12.0 µm, between 12 µm and 40 um, or any wavelength in any range/sub-range defined by any of these values.

The various implementations and/or examples of lasers described herein can be configured to output a wide range of optical powers such as, for example, between about 0.01 mW and about 1.0 mW, between about 1.0 mW and about 10.0 mW, between about 10.0 mW and about 25 mW, between about 15 mW and about 50 mW, between about 20 mW and about 100 mW, between about 50 mW and about 500 mW, between about 100 mW and about 1 W, between about 500 mW and about 1.5 W, between about 1.0 W and about 2.0 W, between about 1.5 W and about 3.0 W, between 3 W and 100 W or any optical power in any range/sub-range defined by any of these values.

The various implementations and/or examples of lasers described herein can be configured to output a laser signal with side mode suppression ratio (SMSR) greater than or equal to about 10 dB. For example, the SMSR of the laser signal can be between about 10 dB and about 60 dB, between about 30 dB and about 70 dB, between about 40 dB and about 100 dB, between about 50 dB and about 200 dB, or any value in any range/sub-range defined by any of these values.

Various implementations and/or examples of lasers described herein comprising a single SGDBR can be configured to have limited wavelength tunability. For example, the wavelength of the laser light output by the various implementations and/or examples of lasers comprising a single SGDBR as described herein can be varied over a wavelength range less than or equal to about 16 nm. The wavelength of the laser light output by the various implementations and/or examples of lasers described herein can be varied, for example, by tuning the SGDBR, the DBR and/or the phase section using electrical and/or thermal methods discussed herein. Various implementations and/or examples of lasers described herein can be configured as high power lasers having limited wavelength tunability.

Various implementations and/or examples of lasers described herein can comprise semiconductor materials or doped glass. Various implementations and/or examples of lasers described herein can comprise one or more waveguide structures.

While the foregoing detailed description discloses several embodiments of the present invention, it should be understood that this disclosure is illustrative only and is not limiting of the present invention. It should be appreciated that the specific configurations and operations disclosed can differ from those described above, and that the apparatus and methods described herein can be used in contexts. Additionally, components can be added, removed, and/or rearranged. Additionally, processing steps may be added, removed, or reordered. A wide variety of designs and approaches are possible.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A laser comprising:
   a gain region including a gain peak, the gain peak comprising:
      a maximum gain; and a gain bandwidth defined at 30% of the maximum gain;
a reflector at one end of the gain region; and
a reflective grating structure at another end of the gain region, the reflector and the reflective grating structure forming a cavity comprising the gain region, the cavity having a plurality of cavity modes spaced apart from each other,
the reflective grating structure having a plurality of reflectance peaks, wherein a spacing between the plurality of reflectance peaks is configured such that only one reflectance peak from the plurality of reflectance peaks is in the gain bandwidth, and
wherein a full width at half maximum of the reflectance peak in the gain bandwidth is greater than or equal to about 0.05 times the cavity mode spacing and less than or equal to about 7 times the cavity mode spacing.

2. The laser of claim 1, wherein the gain region comprises a semiconductor material.

3. The laser of claim 1, further comprising a waveguide integrated with the gain region.

4. The laser claim 1, wherein the reflector comprises a broadband reflector.

5. The laser of claim 1, wherein the reflective grating structure comprises a sampled grating distributed Bragg reflector (SGDBR).

6. The laser of claim 1, wherein the spacing between the plurality of reflectance peaks is greater than or equal to about half the gain bandwidth.

7. The laser of claim 1, wherein the spacing between the plurality of reflectance peaks is greater than or equal to about 15 nm and less than or equal to about 200 nm.

8. The laser of claim 1, wherein a full width at half maximum of the reflectance peak in the gain bandwidth is greater than or equal to about 1 times the cavity mode spacing and less than or equal to about 5 times the cavity mode spacing.

9. The laser of claim 1, wherein the reflectance peak in the gain bandwidth has a reflection magnitude that is at least 20% greater than reflection magnitude of other reflectance peaks of the plurality of reflectance peaks.

10. The laser of claim 1, configured to output laser light with optical power between about 0.1 mW and 10.0 mW.

11. The laser of claim 1, configured to output laser light with optical power between about 100 mW and 3 W.

12. The laser of claim 1, configured to output laser light with optical power between about 1 W and 100 W.

13. A laser comprising:
a gain region having a gain peak, the gain peak comprising:
    a maximum gain; and
    a gain bandwidth defined at 30% of the maximum gain;
a first reflective grating structure at one end of the gain region, the first reflective grating structure having a reflectance peak in the gain bandwidth; and
a second reflective grating structure at another end of the gain region, the gain region, the first reflective grating structure and the second reflective grating structure forming a cavity, the cavity having a plurality of cavity modes spaced apart from each other, the second reflective grating structure having a plurality of reflectance peaks,
wherein a full width at half maximum of the reflectance peak of the first reflective grating structure is greater than or equal to about 0.05 times a spacing between consecutive reflectance peaks of the plurality of reflectance peaks of the second reflective grating structure and less than or equal to about 7 times the spacing between consecutive reflectance peaks of the plurality of reflectance peaks of the second reflective grating structure, and
wherein a full width at half maximum of at least one of the plurality of reflectance peaks of the second reflective grating structure is greater than or equal to about 0.05 times the cavity mode spacing and less than or equal to about 7 times the cavity mode spacing.

14. The laser of claim 13, wherein the first reflective grating structure comprises a distributed Bragg reflector (DBR).

15. The laser of claim 13, wherein the second reflective grating structure comprises a sampled grating distributed Bragg reflector (SGDBR).

16. The laser of claim 13, wherein the full width at half maximum of the reflectance peak of the first reflective grating structure is between about 0.1 nm and about 30 nm.

17. The laser of claim 13, wherein the full width at half maximum of at least one of the plurality of reflectance peaks of the second reflective grating structure is between about 0.01 nm and about 10 nm.

18. The laser of claim 13, wherein the spacing between at least one pair of consecutive reflectance peaks of the plurality of reflectance peaks of the second reflective grating structure is between about 0.1 nm and about 20 nm.

19. A laser cavity comprising:
a gain region having a gain peak, the gain peak comprising:
    a maximum gain; and
    a gain bandwidth defined at 30% of the maximum gain;
a first reflective grating structure at one end of the gain region, the first reflective grating structure having a first plurality of reflectance peaks spaced apart from each other; and
a second reflective grating structure at another end of the gain region, the gain region, the first reflective grating structure and the second reflective grating structure forming a cavity, the cavity having a plurality of cavity modes spaced apart from each other, the second reflective grating structure having a second plurality of reflectance peaks spaced apart from each other,
wherein the spacing between at least one pair of consecutive reflectance peaks of the first plurality of reflectance peaks is between about 1.5 times and about 200 times the spacing between at least one pair of consecutive reflectance peaks of the second plurality of reflectance peaks, such that only one reflectance peak of the first plurality of reflectance peaks is in the gain bandwidth.

20. The laser of claim 19, wherein the first reflective grating structure or the second reflective grating structure comprises a sampled grating distributed Bragg reflector (SGDBR).

* * * * *